United States Patent [19]
Chen et al.

[11] Patent Number: 5,846,648
[45] Date of Patent: Dec. 8, 1998

[54] MAGNETIC ALLOY HAVING A STRUCTURED NUCLEATION LAYER AND METHOD FOR MANUFACTURING SAME

[75] Inventors: Tu Chen, Monte Serino, Calif.;
Michinobu Suekane, Tokyo, Japan;
Makoto Imakawa; Kazuhiko Mitarai, both of Yonezawa, Japan

[73] Assignee: Komag, Inc., San Jose, Calif.

[21] Appl. No.: 802,646

[22] Filed: Feb. 18, 1997

Related U.S. Application Data

[63] Continuation-in-part of Ser. No. 286,653, Aug. 5, 1994, Pat. No. 5,658,659, which is a continuation of Ser. No. 223,636, Apr. 6, 1994, abandoned, and a continuation-in-part of Ser. No. 189,088, Jan. 28, 1994, abandoned, and a continuation-in-part of Ser. No. 733,860, Oct. 18, 1996.

[51] Int. Cl.[6] ......................................................... G11B 5/66
[52] U.S. Cl. .................... 428/332; 428/336; 428/694 T; 428/694 TS; 428/694 TR; 428/650; 428/666; 428/678; 428/668; 428/662; 428/900
[58] Field of Search .......................... 428/694 T, 694 TS, 428/694 TR, 332, 336, 650, 666, 678, 668, 662, 900

[56] References Cited

U.S. PATENT DOCUMENTS

| | | | |
|---|---|---|---|
| 4,652,499 | 3/1987 | Howard | 428/641 |
| 4,769,282 | 9/1988 | Tada | 428/336 |
| 4,786,564 | 11/1988 | Chen | 428/694 TS |
| 4,837,094 | 6/1989 | Kudo | 428/694 T |
| 4,973,525 | 11/1990 | Chien et al. | 428/692 |
| 4,988,578 | 1/1991 | Yamashita et al. | 428/678 |
| 5,062,938 | 11/1991 | Howard et al. | 204/192.2 |
| 5,066,552 | 11/1991 | Howard | 428/694 T |
| 5,162,158 | 11/1992 | Christner | 428/611 |
| 5,314,745 | 5/1994 | Okumura | 428/336 |
| 5,516,547 | 5/1996 | Shimizu | 427/132 |
| 5,658,659 | 8/1997 | Chen | 428/332 |

FOREIGN PATENT DOCUMENTS

| | | |
|---|---|---|
| 0413423 | 2/1991 | European Pat. Off. . |
| 0531035 | 3/1993 | European Pat. Off. . |
| 0704839 | 4/1996 | European Pat. Off. . |
| 59-78518 | 5/1984 | Japan . |
| 1046223 | 2/1989 | Japan . |
| 573880 | 3/1993 | Japan . |
| 5197944 | 8/1993 | Japan . |

OTHER PUBLICATIONS

Williams and Comstock, "An Analytical Model of the Write Process in Digital Magnetic Recording", 17th Annual AIP Conf. Proc., Part I, No. 5, 1971, pp. 738–742.
Zhu et. al., "Micromagnetic Studies of Thin Metallic Films", Journal of Applied Physics, vol. 63, No. 8, 1988, p. 3248.
Chen et. al., "Physical Origin of Limits in the Performance of Thin–Film Longitudinal Recording Media", IEEE Trans. Mag., vol. 24, No. 6, 1988, p. 2700.

(List continued on next page.)

*Primary Examiner*—Leszek Kiliman
*Attorney, Agent, or Firm*—Jonathan A. Small

[57] ABSTRACT

A magnetic recording medium is provided with a structured nucleation layer. The structured nucleation layer comprises a fine-grained seed layer and an intermediate layer. The seed layer (e.g., NiAl, Ti, Cr—Cu, etc.) serves as a template for fine grained-growth of the intermediate layer. The intermediate (e.g., Cr, etc.) layer has preferred crystal textures and an appropriate lattice match to a subsequently deposited magnetic recording layer to allow epitaxial growth of the magnetic recording layer. The intermediate layer provides morphology and orientation to the magnetic recording layer. The magnetic recording layer (e.g., Co-alloy) includes a material which segregates to the alloy grain boundaries to isolate the grains thereof. Each grain of the magnetic recording layer is predominantly a single crystal of small size and uniformly spaced from adjacent grains. The easy axis of the magnetic recording material is predominantly in the plane of the disk, with a random in-plane orientation. Superior magnetic properties are obtained.

25 Claims, 17 Drawing Sheets

OTHER PUBLICATIONS

Chein, C.L., et al., "Magnetic Granular Fe–SiO$_2$ Solids", Journal of Applied Physics, vol. 61(B), 1987, p. 3311.

Liou, S.H., et al., "Granular Metal Films A Recording Media", Applied Physics Letters, vol. 52, No. 8, 1988, p. 512.

Shimizu et al., "CoPtCr Composite Magnetic Thin Films", IEEE Trans. Mag., vol. 28, No. 5, 1992, p. 3102.

Murdock et al., "Noise Properties of Multilayered Co–Alloy Magnetic Recording Media", IEEE Trans. Mag., vol. 26, 1990, pp. 2700–2705.

Yogi et al., "Longitudinal Media for 1 Gb/in$^2$ Areeal Density", IEEE Trans. Mag. vol. 26, 1990, p. 2271.

Lee et al., "NiAl Underlayers for CoCrTa Magnetic Thin Films", IEEE Trans. Mag., vol. 30, No. 6, pp. 3951–3953 (Nov. 1994).

Lee et al., "Effects of Cr Intermediate Layers on CoCrPt Thin Film Media on NiAl Underlayers", IEEE Trans. Mag., vol. 31, No. 6, pp. 2728–2730 (Nov. 1995).

Maeda, H., "High Coercivity Co and Co–Ni Alloy Films", J. Appl. Phys., vol. 53, No. 5, pp. 3735–3739 (May 1982).

El–Hilo, et al., "Interactions In CoPtCr/SiO$_2$ Composite Thin Films", IEEE Trans. Mag. vol. 29, No. 6, pp. 3724–3726 (Nov. 1993).

Thompson, et al., "The Effects of Oxygen On Cobalt Titanium and Cobalt Platinum Thin Films", IEEE Trans. Mag., vol. Mag–22, No. 5, pp. 635–637 (Sep. 1986).

Deng et al., "Mangetic Properties and Crystal Texture of Co Alloy Thin Films Prepared on Double Bias Cr", J. Appl. Phys., vol. 73, No. 10, pp. 6677–6679 (May 15, 1993).

Hono, K., et al., "Crystallography of Co/Cr bilayer magnetic thin films", Journal of Applied Physics vol. 68, Nov. 1990.

D. J. Chakrabarti, et al, Chromium—Copper, Bull. Alloy Phase Diagrams, 5(1), Feb. 1984.

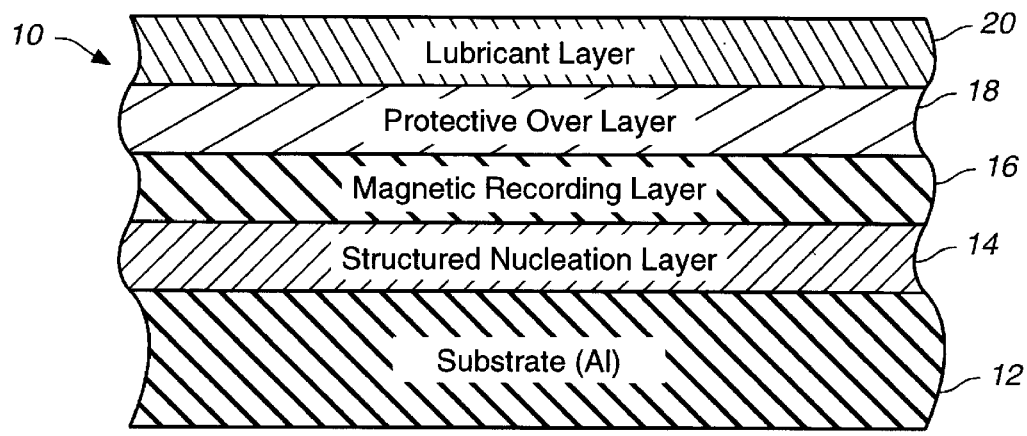
FIG._1
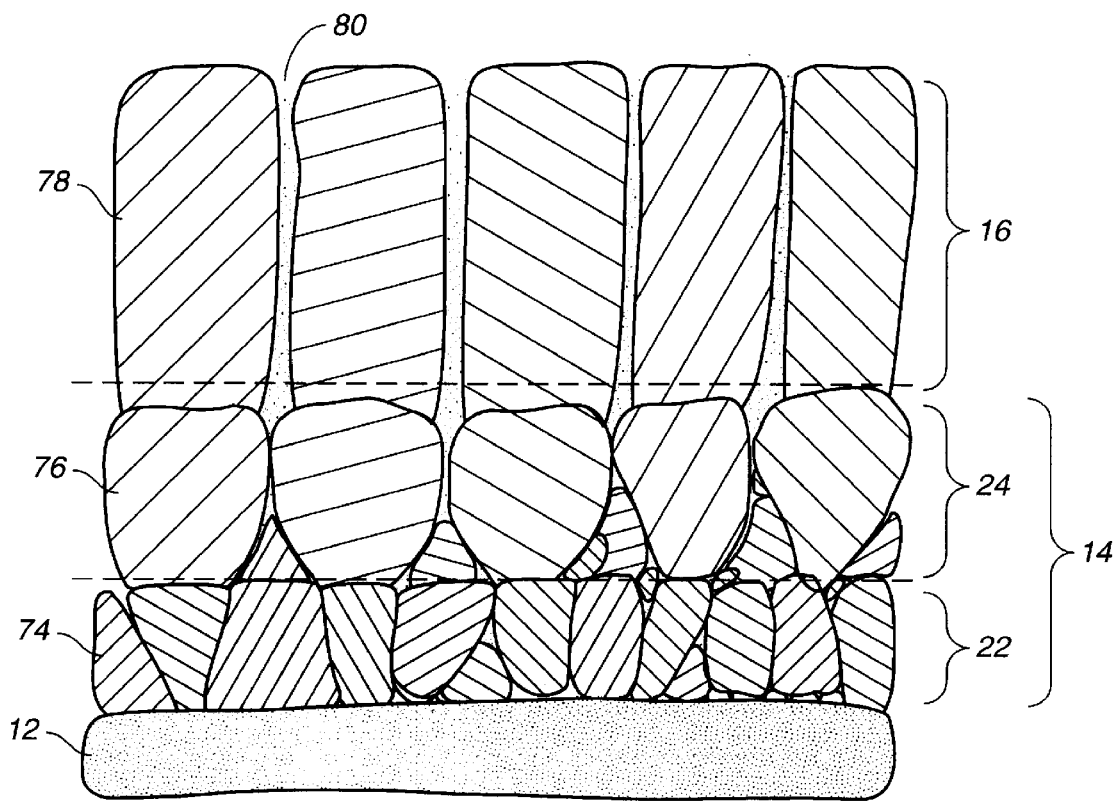
FIG._2

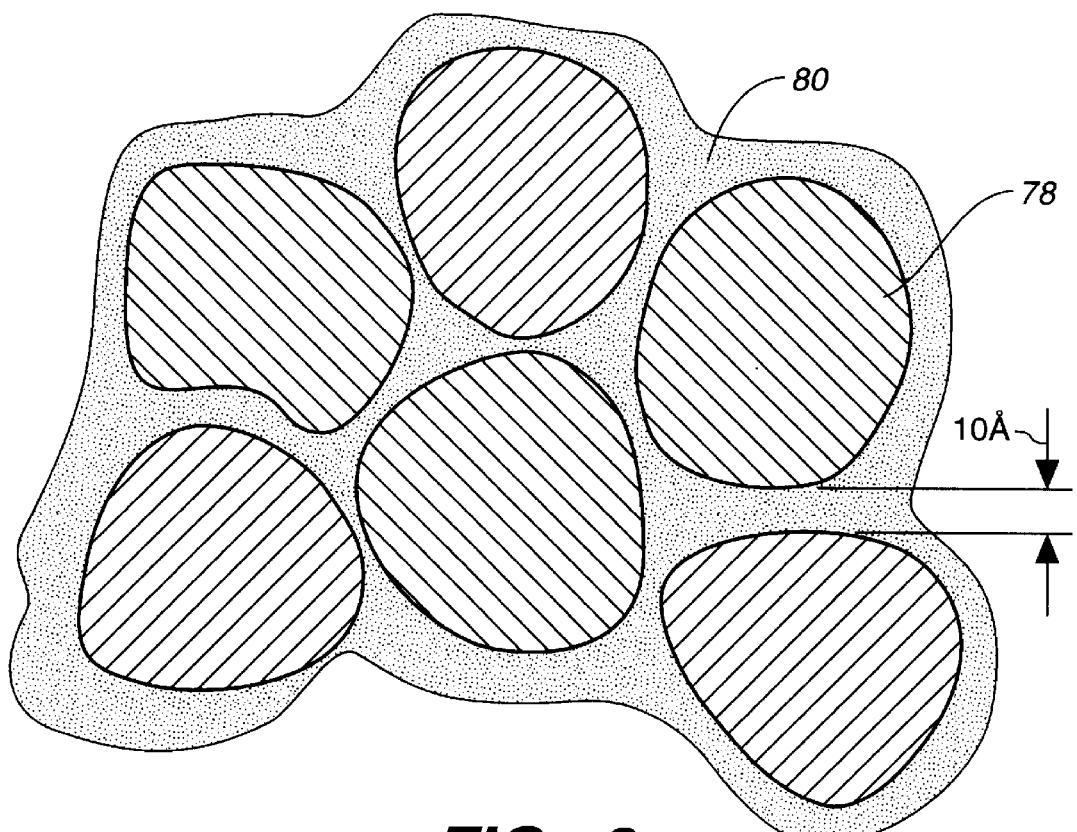
FIG._3

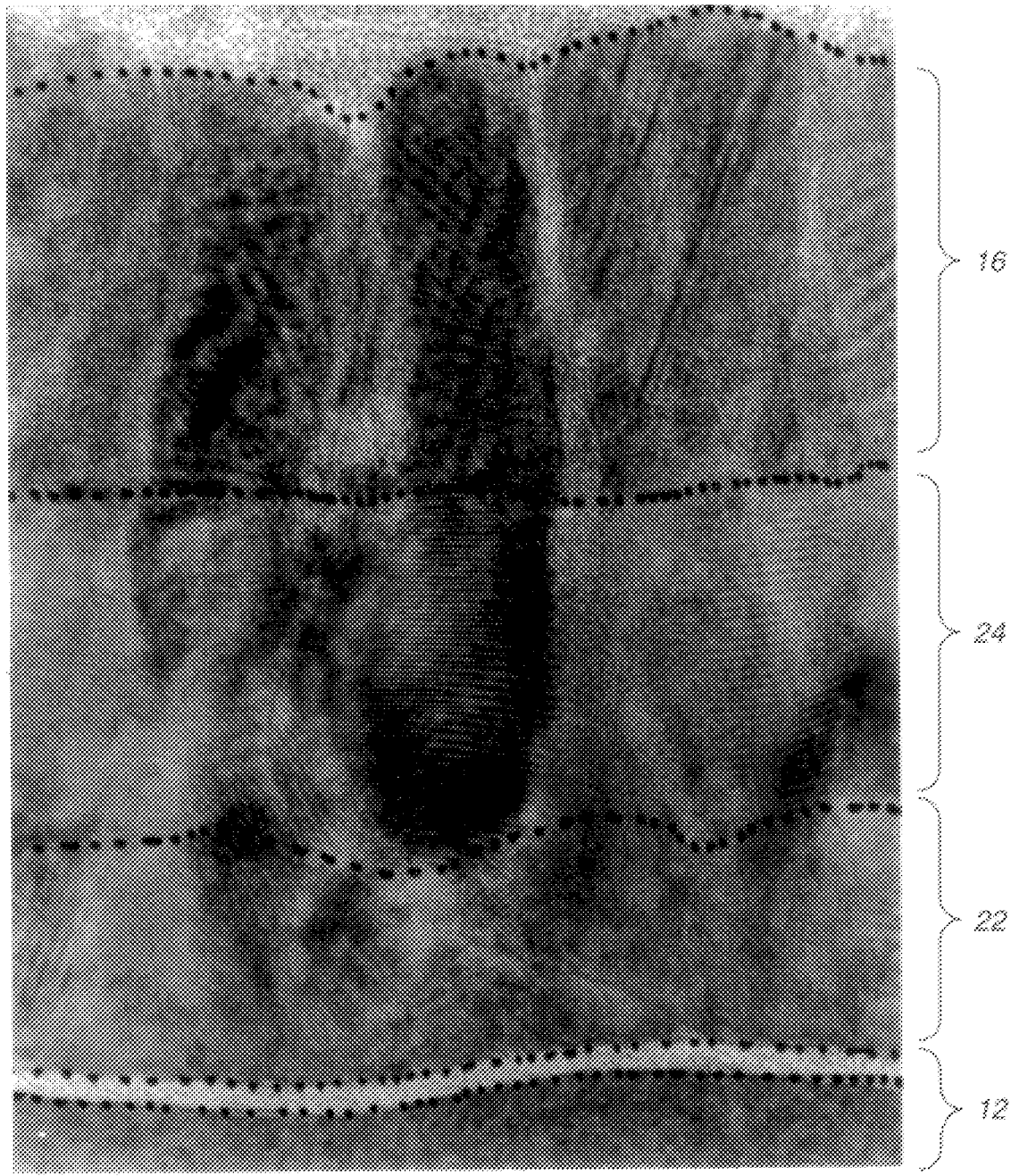
FIG._4

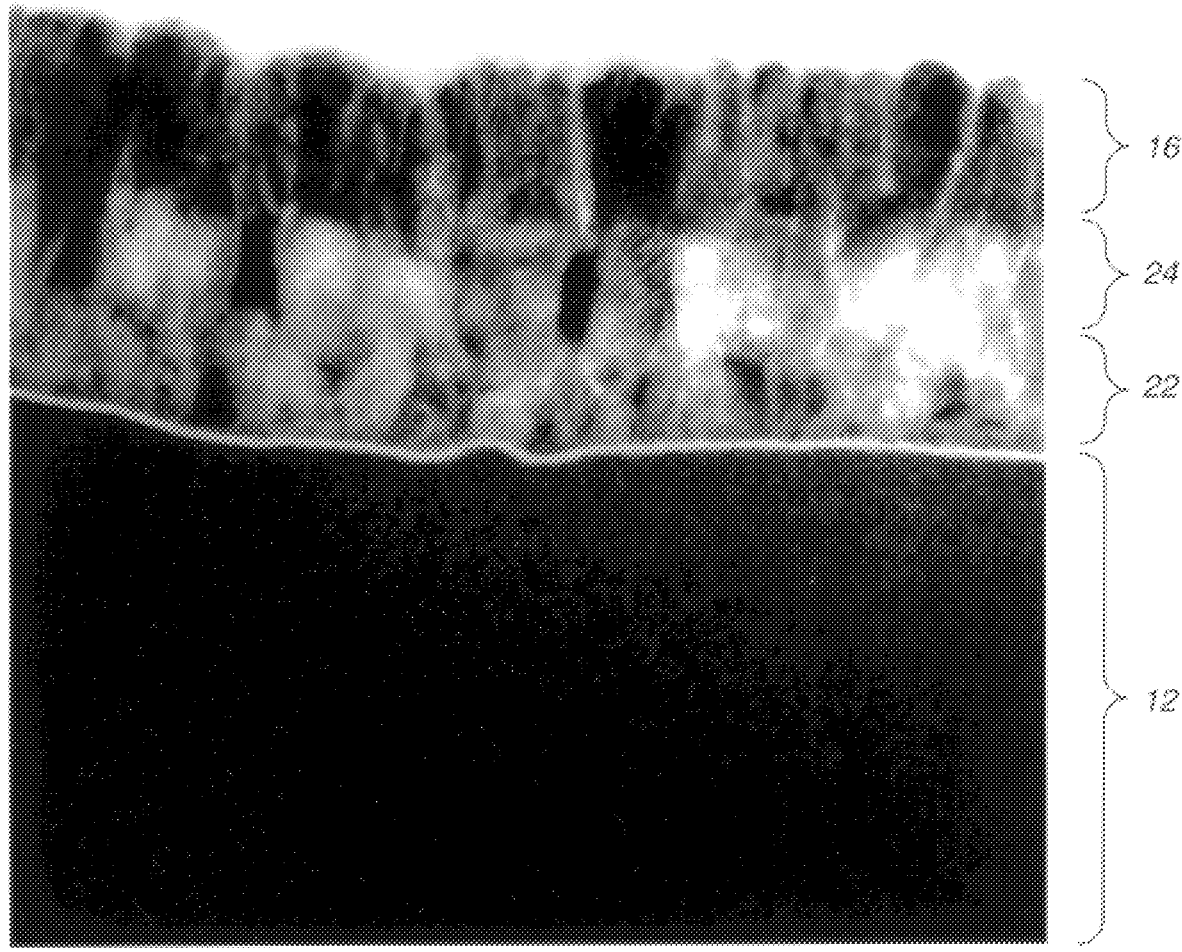
FIG._5

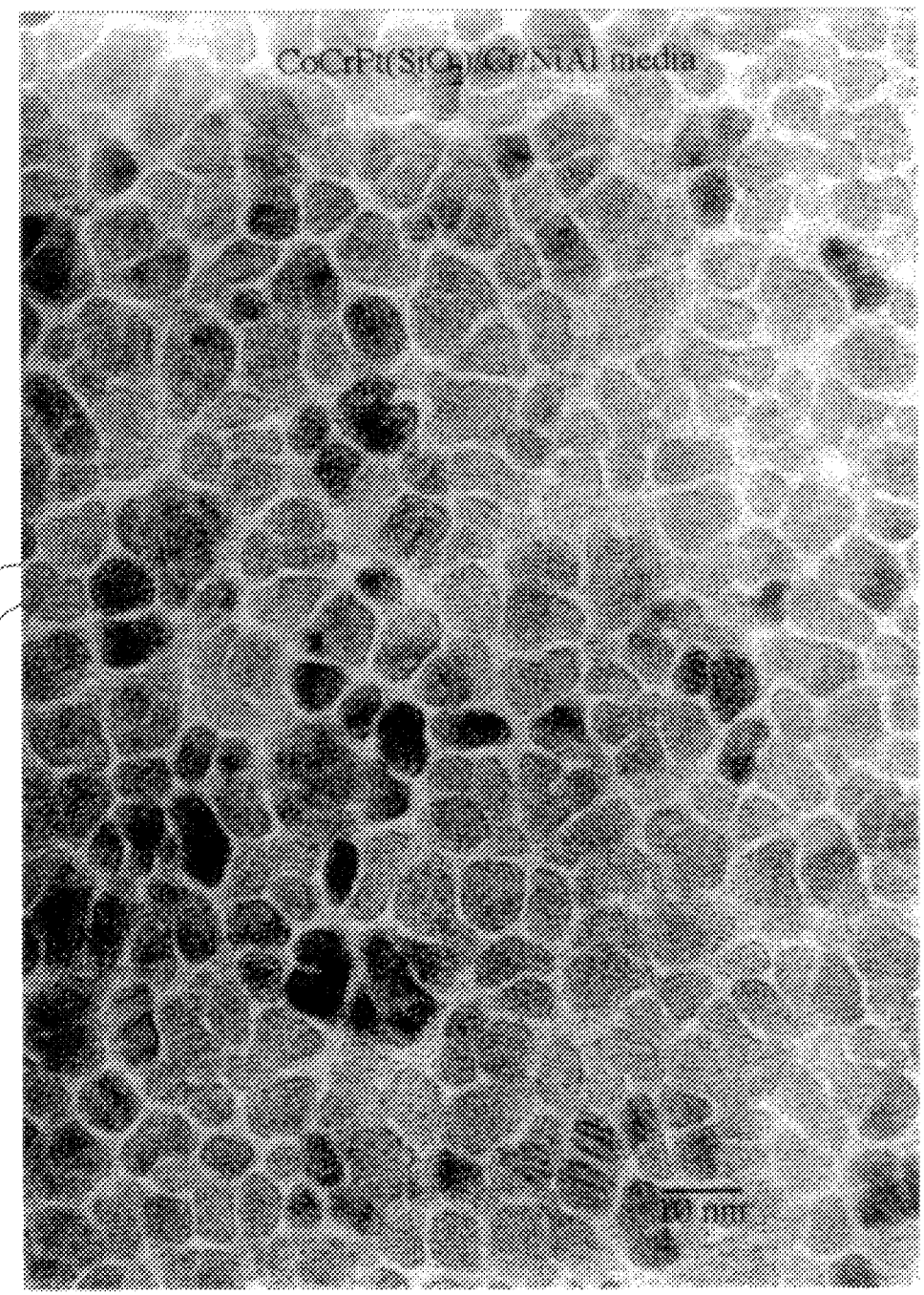
FIG._6

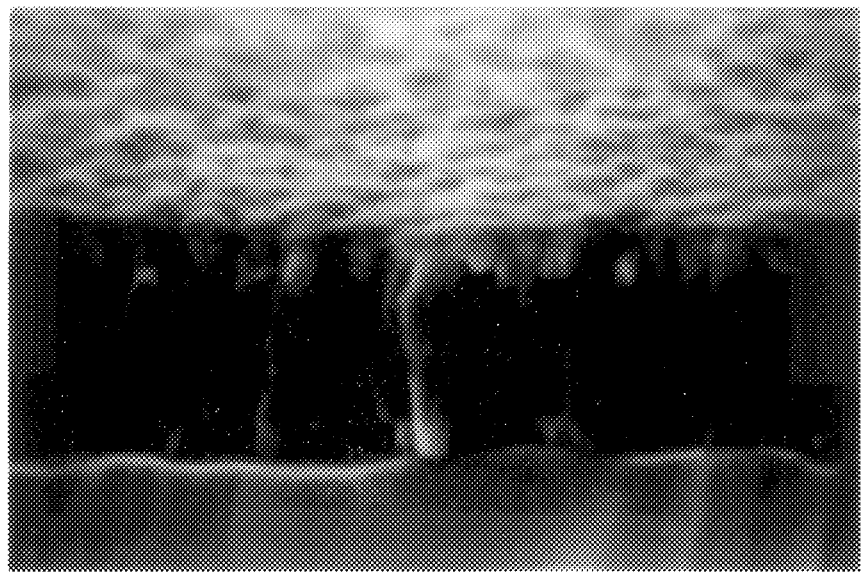
FIG._7
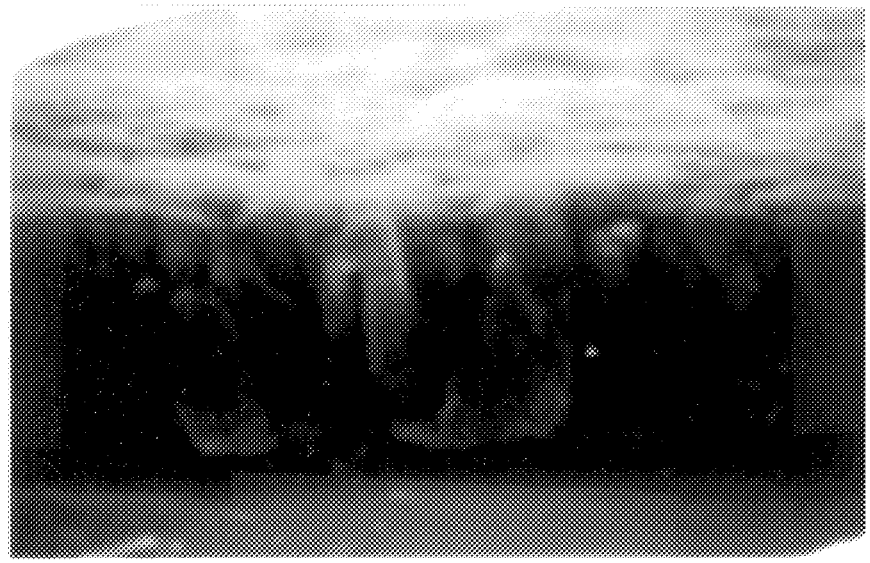
FIG._8

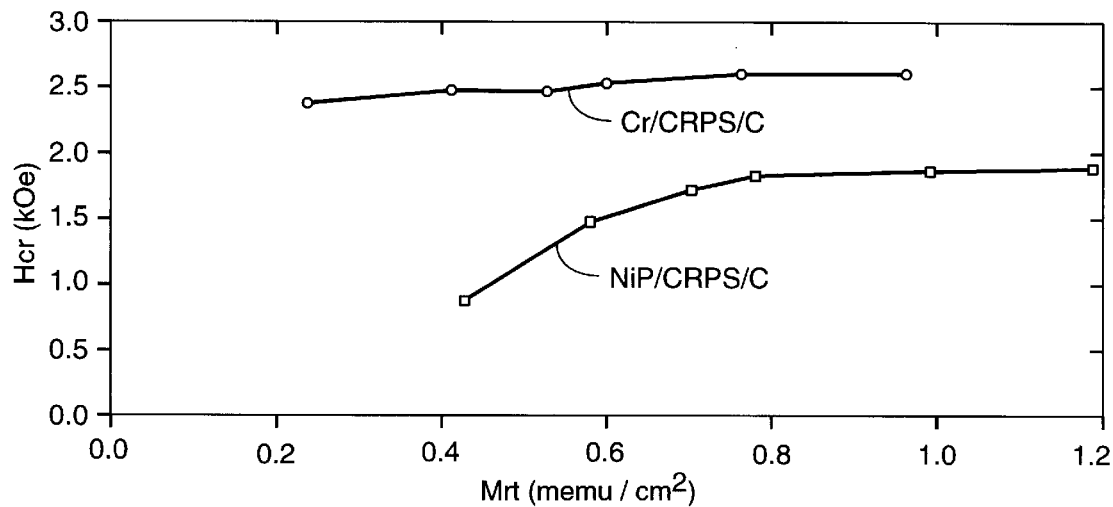
FIG._9
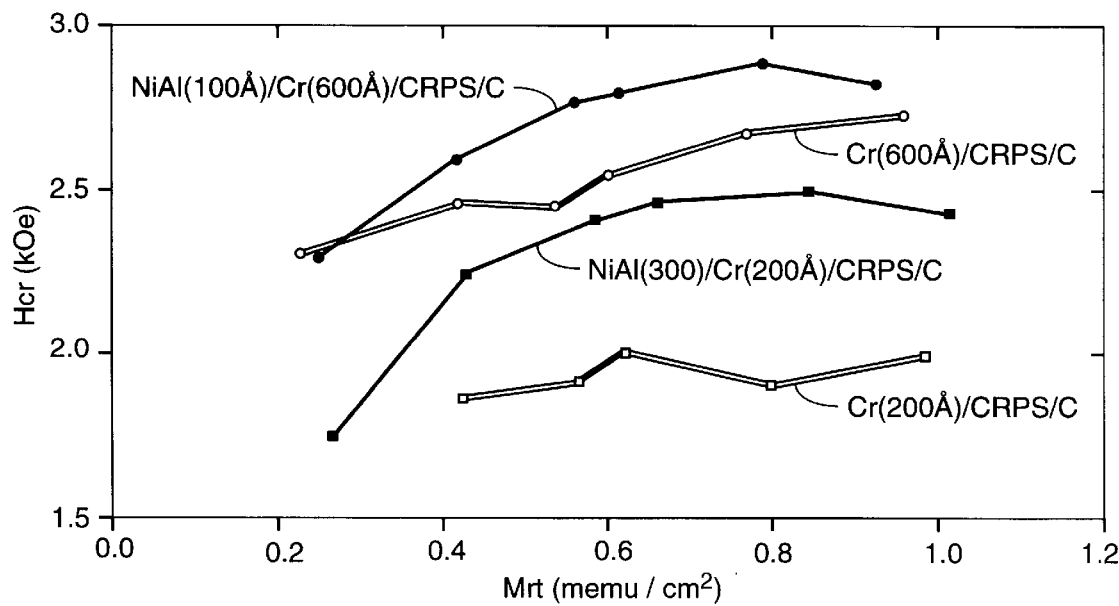
FIG._10

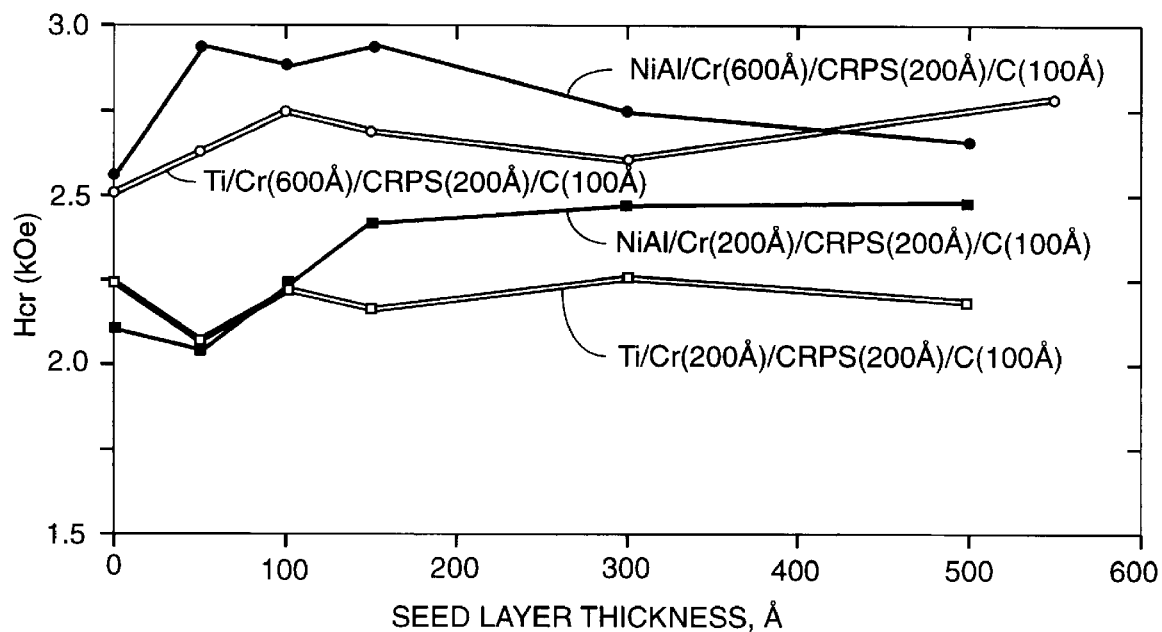
FIG._11
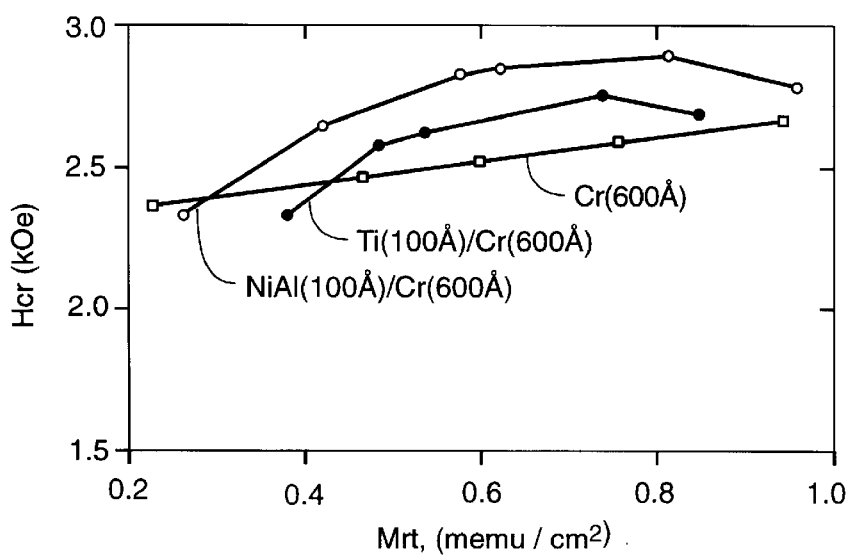
FIG._12

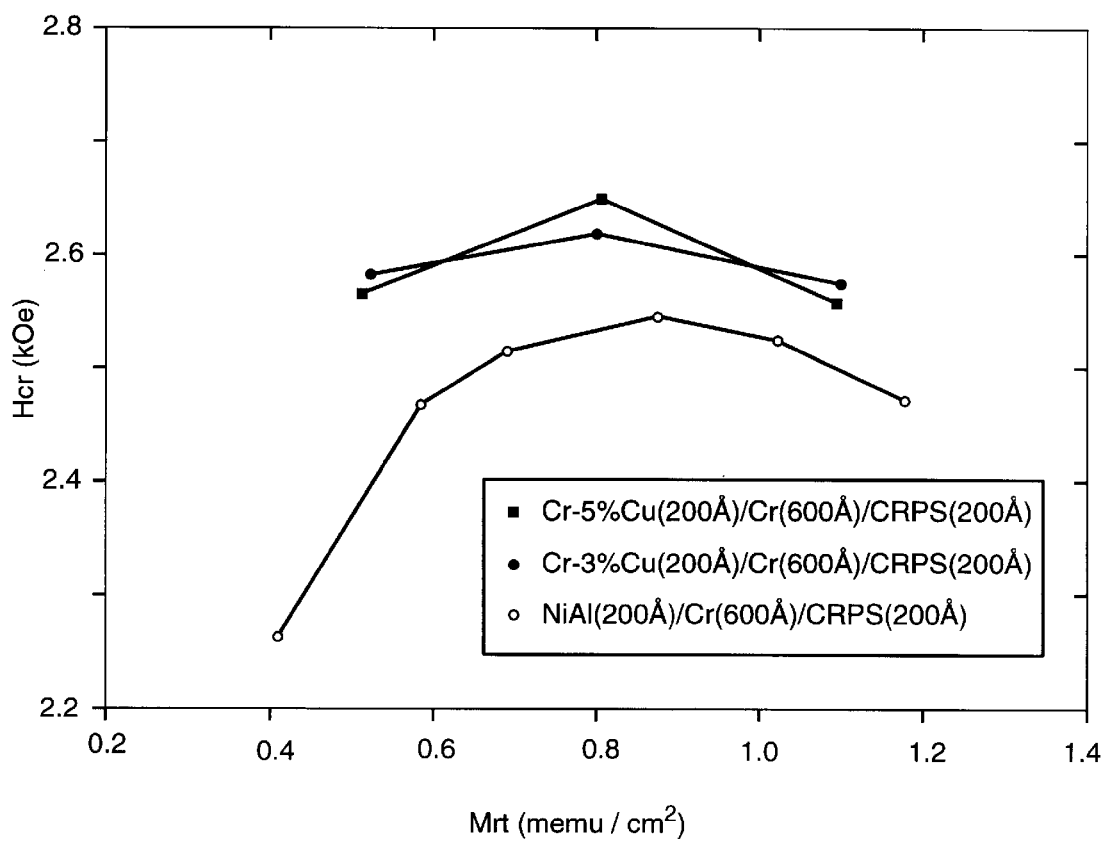
FIG._13

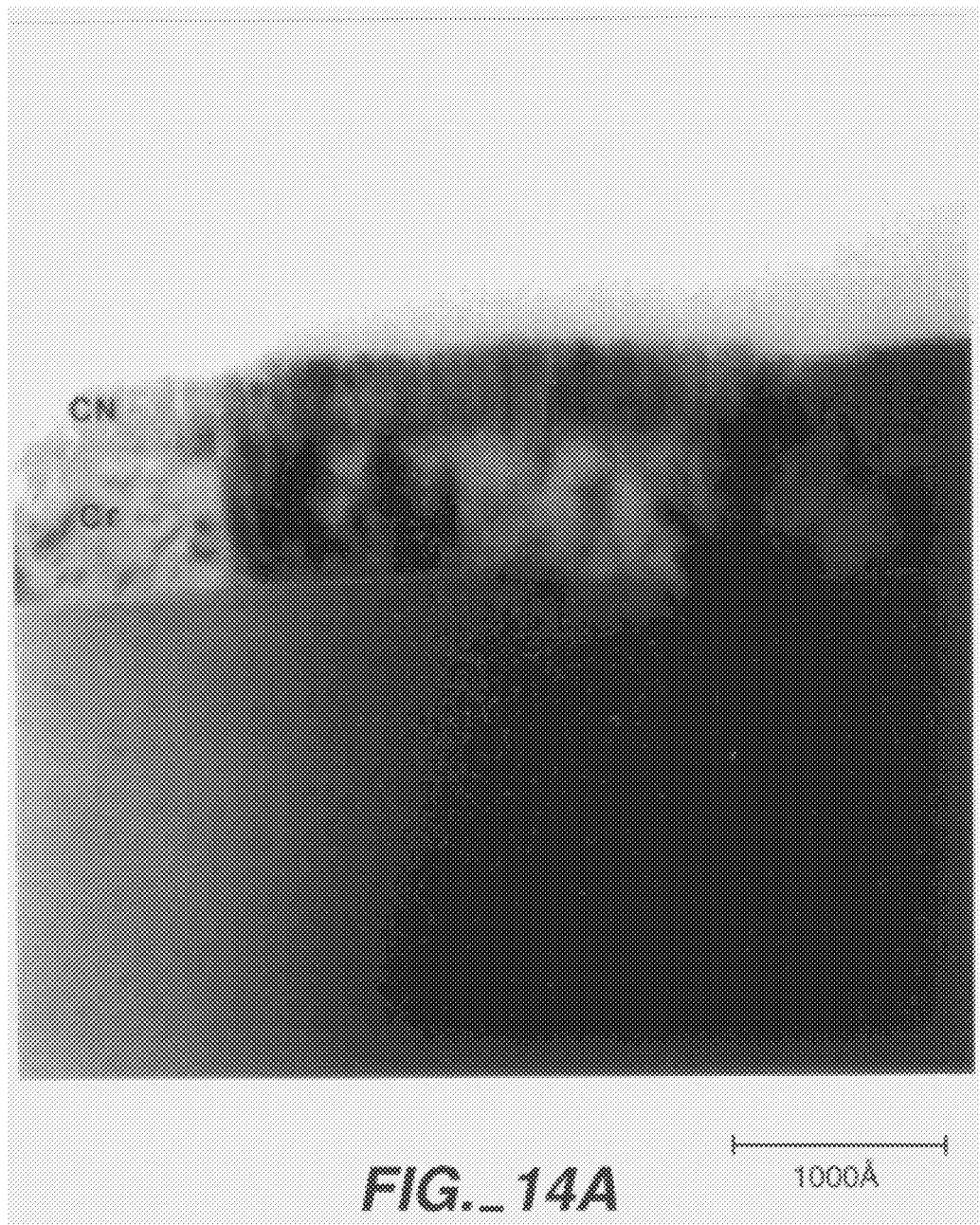
FIG._14A  1000Å

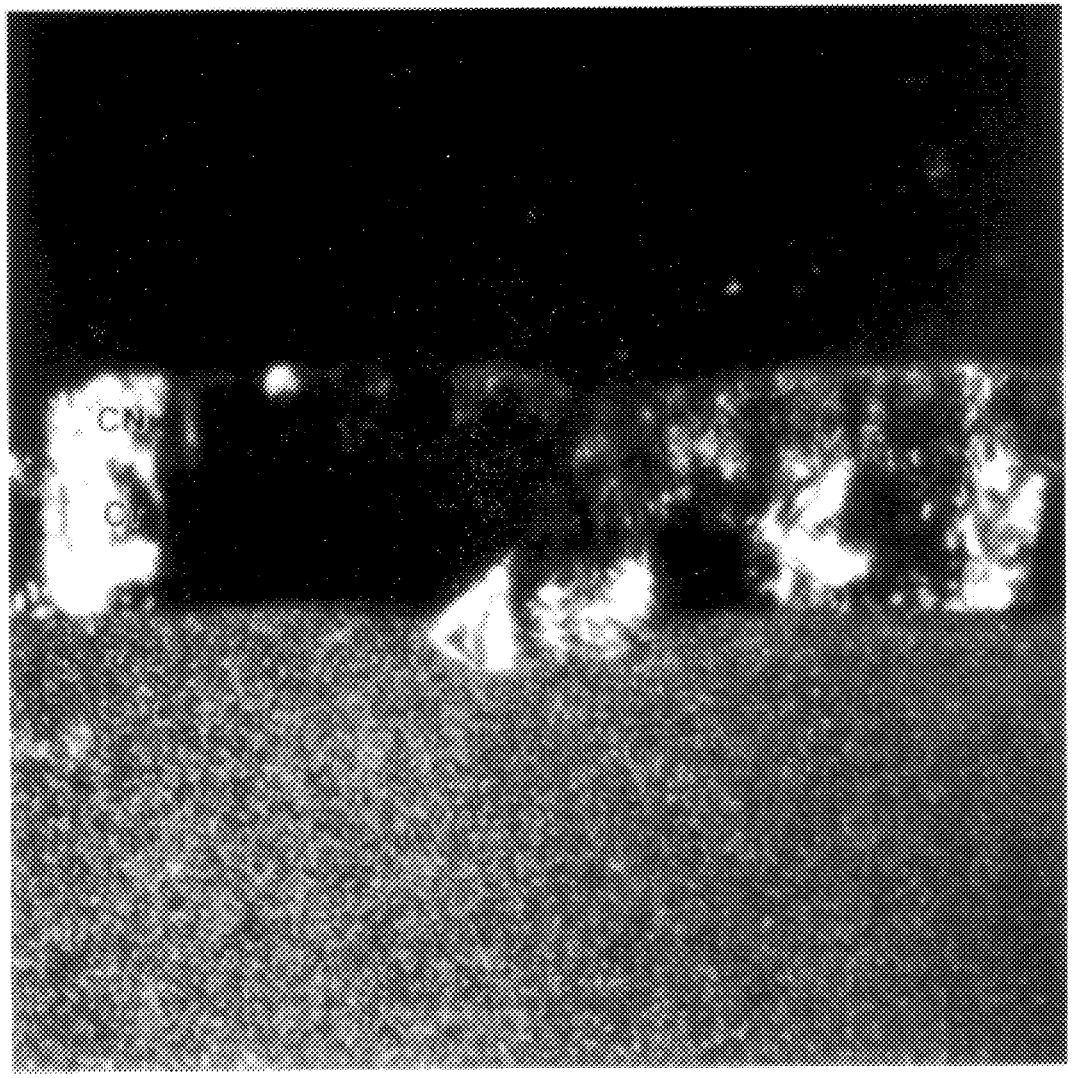
FIG._14B  1000Å

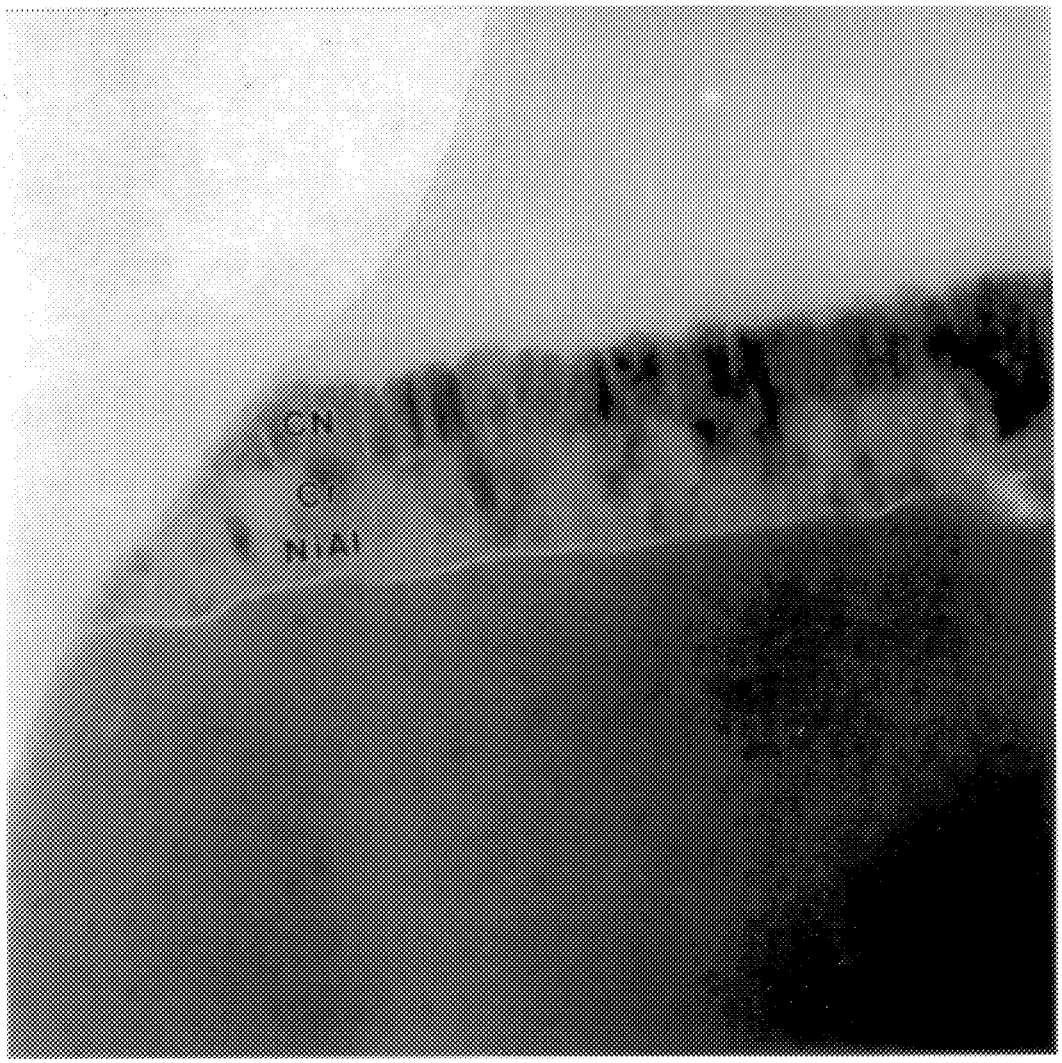
FIG._15A    1000Å

FIG._15B

FIG._16A

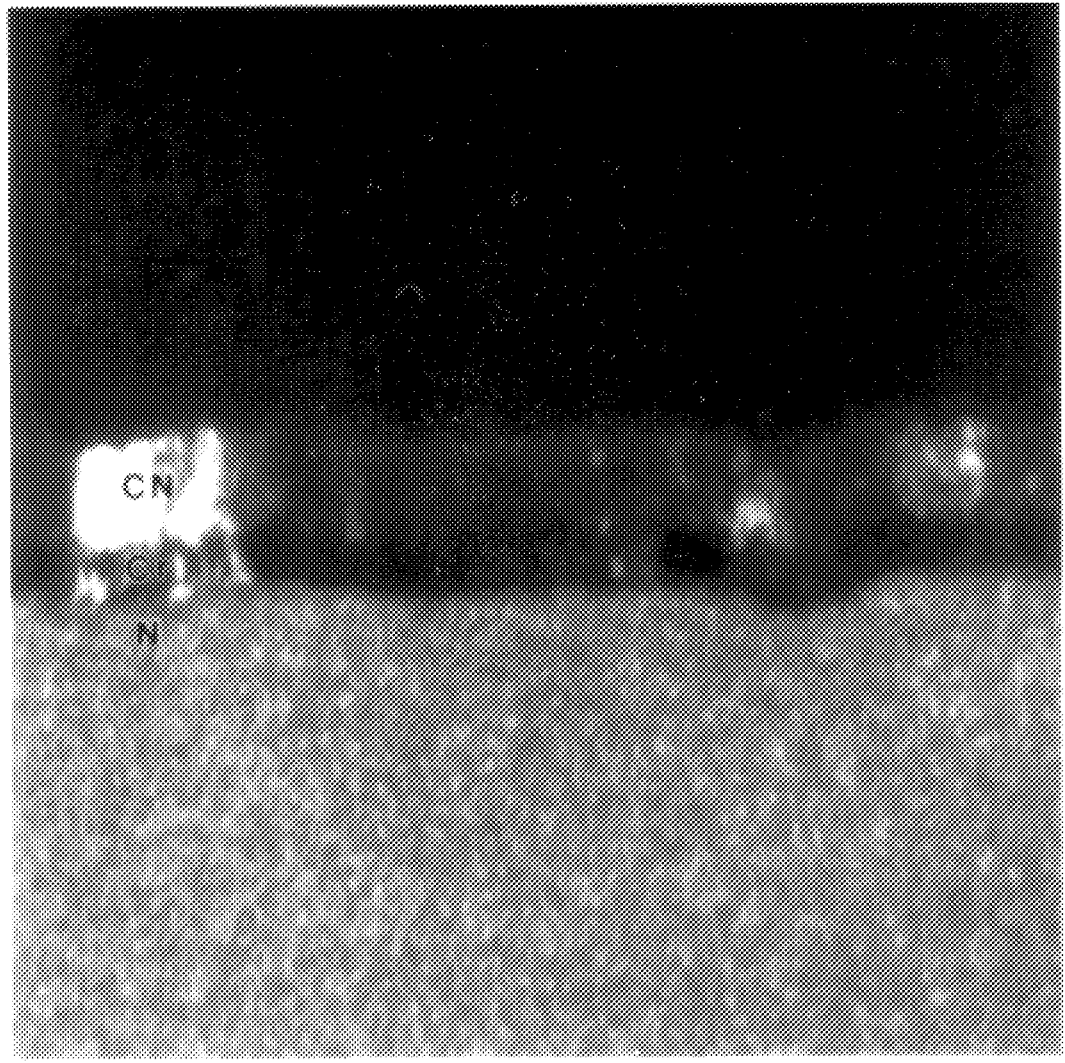
FIG._16B

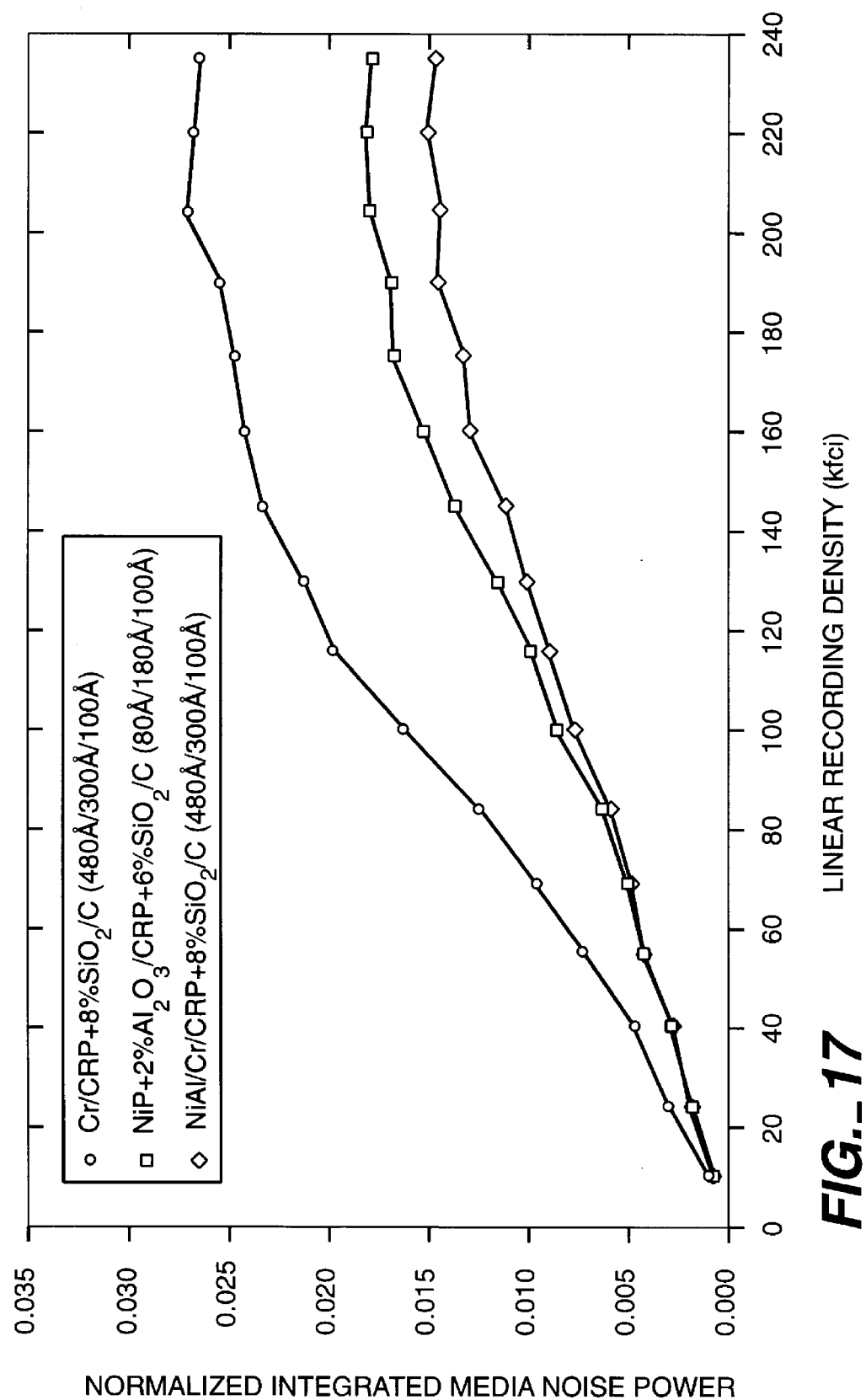
FIG._17

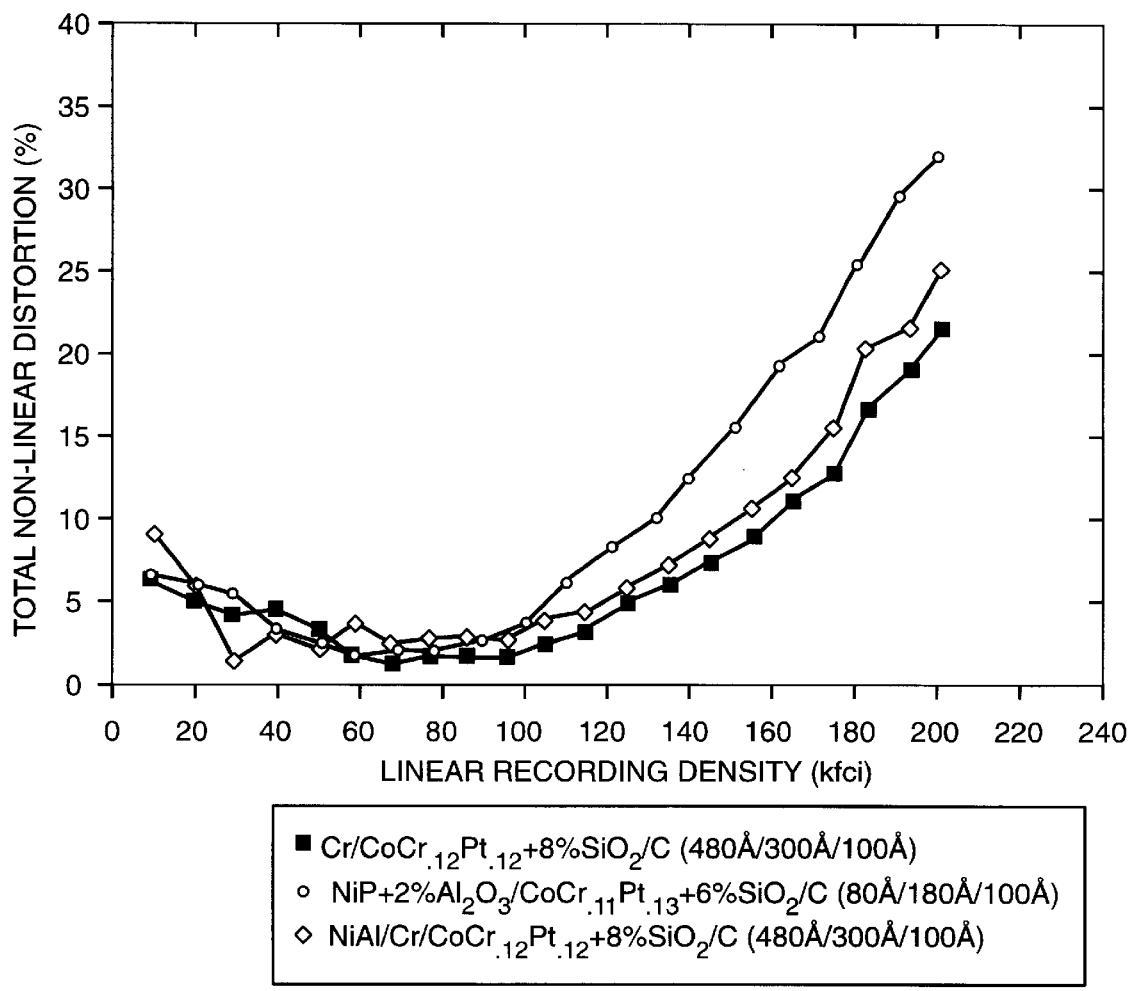
FIG._18
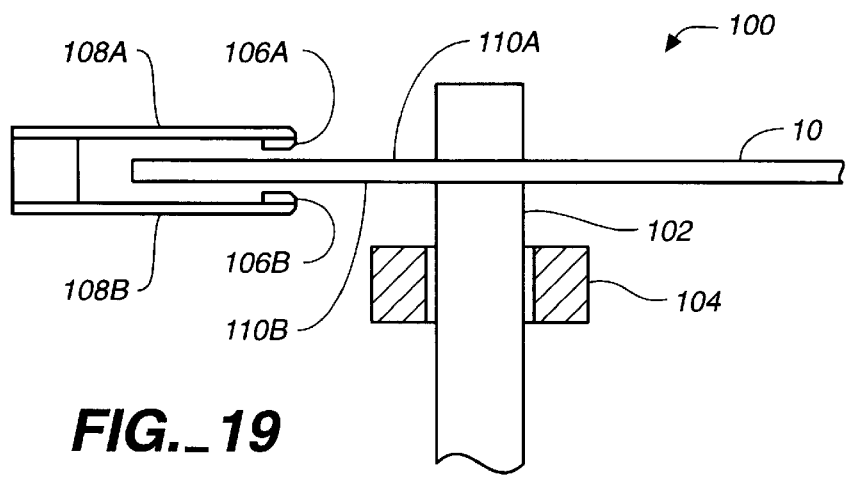
FIG._19

MAGNETIC ALLOY HAVING A STRUCTURED NUCLEATION LAYER AND METHOD FOR MANUFACTURING SAME

This is a continuation-in-part of U.S. patent application Ser. No. 08/286,653, filed Aug. 5, 1994, now U.S. Pat. No. 5,658,659 which is a continuation of U.S. patent application Ser. No. 08/223,636, filed Apr. 6, 1994, now abandoned and a continuation-in-part of U.S. patent application Ser. No. 08/189,088, filed Jan. 28, 1994, now abandoned and a continuation-in-part of U.S. patent application Ser. No. 08/733,860, filed Oct. 18, 1996, now pending each of said applications being incorporated herein by reference.

FIELD OF THE INVENTION

The present invention relates generally to the manufacture of magnetic recording media used in rigid disc drives commonly used for computer data storage. In particular, the present invention is a magnetic medium, and a method for forming such a medium, comprising a seed layer, an intermediate layer, and a magnetic alloy recording layer including a selected segregant, deposited in that order upon a substrate. The magnetic alloy recording layer is epitaxially grown on the intermediate layer. High squareness and simultaneously low noise and low non linear transition shift are achieved.

BACKGROUND

Recording performance for magnetic disks is commonly determined by several basic characteristics, including— half-amplitude pulse width (PW50), overwrite (OW), noise, and total non linear distortion (TNLD). A wide PW50 means that adjacent bits are crowded together, resulting in adjoining bits interfering with one another. This interference is termed inter-symbol interference. Excessive inter-symbol interference limits the linear packing density of bits in a given track, hence reducing the packing density in a given area, and hence limiting the recording capacity of the magnetic media. Thus, narrow PW50 allows for higher recording density.

One means of reducing (or narrowing) PW50 is to reduce the thickness of the magnetic layer of the medium. Another means of reducing PW50 is to increase hysteresis loop squareness ("S", including coercivity squareness "S*" and remanent coercivity squareness "S*rem"), and narrow the switching field distribution ("SFD"), as described by William and Comstock in "An Analytical Model of the Write Process in Digital Magnetic Recording," A.I.P. Conf. Proc. Mag. Materials 5, p. 738 (1971). Yet another means for reducing the PW50 is to increase the coercivity ("Hc") of the medium.

Overwrite ("OW") is a measure of the ability of the medium to accommodate overwriting of existing data. That is, OW is a measure of what remains of a first signal after a second signal (for example of a different frequency) has been written over it on the medium. OW is low, or poor when a significant amount of the first signal remains. OW is generally affected by the coercivity, the squareness, and the SFD of the medium. For future high density recording, higher Hc media will be preferred. However, gains in Hc are generally accompanied by losses in OW. Thus, there is a need in the art to improve the S* and the SFD to obtain improvements in OW.

Noise performance of a magnetic film is typically defined in terms of read jitter and write jitter. Read jitter is primarily determined by the amount of signal available from a bit, and the head noise plus electronic noise in the channel. A thicker magnetic film will typically provide reduced read jitter. Write jitter is determined by the intrinsic noise of the film. Intrinsic media noise has been theoretically modeled by Zhu et al. in "Micromagnetic Studies of Thin Metallic Films", J. Appl. Phys., vol. 63, no. 8, p. 3248 (1988), which is incorporated by reference herein. Chen et al. describe the source of intrinsic media noise in "Physical Origin of Limits in the Performance of Thin-Film Longitudinal Recording Media," IEEE Trans. Mag., vol. 24, no. 6, p. 2700 (1988), which is also incorporated by reference herein.

The primary source of intrinsic noise in thin film media is from intergranular exchange coupling, resulting in relatively large magnetic domains. In the following description, "magnetic grain" refers to physically discrete particles of magnetic material, while "magnetic domain" refers to one or more magnetic grains which, due to exchange coupling (magnetic interaction between the grains), switch together in the presence of a magnetic field. In general, a higher intergranular exchange results in higher S* and lower SFD due to the co-operative switching of magnetic grains. However, a high exchange interaction results in higher intrinsic noise due to formation of large magnetic domains. The noise from intergranular exchange coupling can be reduced by isolating the individual grains. This may be accomplished by physically spacing the grains apart from one another as described by Chen et al. in the aforementioned "Physical Origin of Limits in the Performance of Thin-Film Longitudinal Recording Media". The amount of separation need be only a few angstroms for there to be a significant reduction in intergranular exchange coupling.

There is another intergranular interaction, called magnetostatic interaction, which acts over a much greater distance between particles as compared to the exchange interaction. Reducing the magnetostatic interaction does reduce intrinsic media noise slightly. However, the effects of magnetostatic interaction actually improve hysteresis loop squareness and narrow the switching field distribution (but to a lesser extent than the exchange interaction), and hence improve PW50 and OW. Therefore, magnetostatic interaction is generally desirable and hence tolerated.

TNLD is the result of intersymbol interference between adjacent bits and the partial erasure of a bit at the transition during writing. TNLD can be reduced by increasing the coercivity and reducing the remanent magnetization-thickness product ("Mrt", where Mr is the remanent magnetization and t is thickness of the magnetic layer), and is believed to be generally described by the micromagnetic theory. Magnetic film composition and deposition processes may be used to reduce TNLD. Since TNLD increases as the recording density increases, it is becoming an increasingly critical parameter as recording density increases, and magnetic film compositions and deposition processes must be developed to optimize this parameter.

In order to obtain the best performance from the magnetic media, each of the above criteria—PW50, overwrite, noise, and TNLD—must be optimized. This is a formidable task, as each of these performance criteria are interrelated. For example, obtaining a narrower PW50 and reducing TNLD by increasing Hc will adversely affect overwrite, since increasing Hc degrades overwrite. A thinner medium having a lower Mrt yields a narrower PW50, better OW, and lower TNLD, however the signal to noise ratio decreases because the media signal is reduced. Increasing squareness of the hysteresis loop contributes to narrower PW50, better OW, and lower TNLD, but may increase noise due to intergranular exchange coupling and magnetostatic interaction. (The dominant intrinsic noise in the media is the noise arising from intergranular exchange coupling.) Since it is a known goal to eliminate intergranular exchange coupling to reduce the major intrinsic media noise, the amount that PW50 may be narrowed, OW improved, and TNLD lowered has heretofore been limited by the increase in tolerable noise level arising from the magnetostatic interaction of the media.

Therefore, an optimal thin film magnetic recording medium for high density recording applications, i.e., that can support high bit densities, will require low noise without adversely sacrificing PW50, OW and TNLD. One type of magnetic medium which has allowed optimizing certain of the above performance criteria is based on alloys of cobalt (Co) and platinum (Pt), due to the alloys' ability to provide high Hc and high magnetic moment.

The media noise of CoPt based alloys can be reduced by a number of different approaches, but as described in the following, these methods suffer from loss of hysteresis loop squareness (i.e., lower S* and higher SFD), increased PW50, decreased OW, increased TNLD, and other disadvantages. One such approach described by Chen et al. in the aforementioned "Physical Origin of Limits in the Performance of Thin-Film Longitudinal Recording Media" teaches deposition of the magnetic alloy by sputtering in a high argon pressure environment. Basically, the application of high argon pressure results in isolated, exchange decoupled grains. Although media noise is reduced, S* and OW are decreased, and SFD increased resulting in an increase in PW50.

In another approach, taught by Howard et al. in U.S. Pat. No. 5,066,552, in order to decrease the media noise oxygen is introduced into the magnetic film in a concentration of 5 to 30 atomic percent (at. %). Howard et al. teach the formation of a magnetic layer by vacuum sputtering in an argon atmosphere into which oxygen has been introduced. Oxygen is thereby introduced into the magnetic layer from the sputtering environment. However, as pointed out by Howard et al. in said patent, introducing oxygen decreases both Hc and S*.

Howard et al.'s U.S. Pat. No. 5,062,938, teaches oxidizing the magnetic grains after growth. However, there are a number of additional shortfalls to the approaches taught by Howard et al. ('938). First, the additional step of oxidizing a sputtered layer after depositing an impurity adds to the manufacturing complexity and cost. Second, nothing is taught about controlling the formation of the oxides. Third, nothing is taught about controlling grain size and grain uniformity.

Yet another approach is to make granular films having grains of magnetic alloys containing $SiO_2$. Details about these films have been described by C. L. Chien et al. in "Magnetic Granular Fe—$SiO_2$ Solids", J. Appl. Phys., 61(B), p. 3311 (1987), and S. H. Liou et al. in "Granular Metal Films a recording Media", Appl. Phys. Lett., 52(8), p. 512 (1988). Essentially, these researchers were depositing Fe—$SiO_2$ either by co-sputtering or by using composite targets, and the magnetic films were deposited without underlayers. The values for Hc of around 1100 Oe and for squareness (S) of around 0.6 were obtained. These values are unacceptably low for high density recording applications.

Similarly, addition of $SiO_2$ has been exploited, as described by Shimizu et al. in "CoPtCr Composite Magnetic Thin Films", IEEE Trans. Mag., vol. 28, no. 5, page 3102 (1992), and its companion patent applications: European Patent Application 0 531 035 A1, published Mar. 10, 1993, and Japanese Patent Application 5-73880, published Mar. 23, 1993; and issued U.S. Pat. Ser. No. 5,516,547. Specifically, lower media noise and higher in-plane coercivity were noted with an introduction of approximately 10% by volume (vol. %) $SiO_2$. The aforementioned paper of Shimizu et al. indicates that S* of these films were generally around 0.6. Thus, although media including $SiO_2$ showed lower media noise and higher Hc, the squareness obtained was again too low to meet the requirements for high density recording. It should also be noted that Shimizu et al. required approximately 17–18 at. % of Pt in the alloys. Such high percentage of Pt significantly increases the manufacturing cost of such media (although for media designed for use with magneto-resistive heads, e.g., having an Mrt of about 1.0 memu/$cm^2$, a higher platinum content may be required to maintain Hc). Furthermore, it should be noted that Shimizu et al. achieved a peak Hc of only 1700 Oe, an unacceptable limit for future high density recording applications.

Another approach, discussed in Japanese Patent Application 5-197944, published Aug. 6, 1993 (Murayama et al.) is addition of $SiO_2$ for increased Hc while sputtering in the presence of a broad range of $N_2$, for example 0.1 to 10%. Lower media noise was obtained, but at the cost of decreasing S* as the percentage of $SiO_2$ increased. Thus, lower media noise was obtained at the cost of increasing PW50 and OW. Additional teachings relating to $SiO_2$ may be found in U.S. Pat. Nos. 4,837,094 to Kudo (teaching an amorphous alloy) and 4,769,282 to Tada et al. (teaching an alloy including rare earth elements).

Importantly, all of these references employing $SiO_2$ teach alloying or admixing the $SiO_2$ with the magnetic film constituents, as opposed to depositing $SiO_2$ and the magnetic film constituents under conditions such that there is co-deposition but only minimal alloying of the $SiO_2$ with the magnetic film material. There are a number of disadvantages to the alloying or admixing of impurities. First, the addition of an impurity material (e.g., up to 30 vol. % $SiO_2$ by Shimizu et al.) results in a decrease in saturation magnetization (Ms) and hence a decrease in Mr. Therefore, these references require that the thickness of the magnetic layer be increased to maintain sufficient Mrt. This is undesirable because an increase in film thickness implies an increase in spacing loss, which results in a larger PW50 and worse OW. Second, the sputtering process is made more complex and more costly by the requirement that additional materials be sputtered. Third, the alloyed or admixed impurity does nothing to increase grain isolation to thereby reduce exchange coupling induced noise.

Murdock et al. in "Noise Properties of Multilayered Co-Alloy Magnetic Recording Media", IEEE Trans. Mag., vol. 26, p. 2700–2705 (1990) teach deposition of multiple layers of magnetic material, the layers isolated from each other by layers of nonmagnetic material to reduce media noise. It is theorized that grain size and spacing may be relatively controlled several grains in thickness above an under layer. As a film grows thicker, the grains tend to vary in size and position. Thus, Murdock et al. teach controlling grain size and spacing by deposition of an under layer, forming a thin magnetic layer thereon several grains in thickness, forming on this magnetic layer another under layer, forming on that under layer another thin magnetic layer, and so on. Although media noise is reduced due to smaller isolated grains, the SFD is increased and the squareness is reduced due to a difficulty in matching the Hc of the individual layers.

Moreover, the grain size of the thinner magnetic layers may be reduced so much that the magnetic grains may become superparamagnetic, resulting in a dramatic decrease in Hc. Manufacturing of such multilayered films is also very difficult and requires additional process chambers over current equipment requirements. In addition, special attention is needed to design the manufacturing process to minimize oxidation of thinner magnetic layers. Thus, although the multi-layer approach does teach a method for reducing media noise, the current processes yield decreased squareness and are difficult and expensive to implement.

In much of the magnetic recording media produced today, the $[0002]_{Cr}$ or C-axis (easy axis of magnetization) of the Co-based magnetic alloy crystals are parallel or predominantly parallel to the plane of the disk (referred to herein as "in-plane" orientation, and intended to cover both in-plane and predominantly in-plane orientations). This is accomplished in various ways well known in the art. The most common method of achieving in-plane C-axis orientation of a Co-alloy film is use of a Cr underlayer to promote grain-to-grain epitaxial growth of the hexagonal cross-packed (HCP) Co grains on the body center cubic (BCC) Cr grains. It has been shown by K. Hono, B. Wong, and D. E. Laughlin in the article "Crystallography of Co/Cr bilayer magnetic thin films", Journal of Applied Physics 68 (9) p. 4734 (1990), that in-plane C-axis orientation may be achieved through epitaxial growth of Co on Cr with one of the following lattice plane relations $(002)_{Cr}//(11\bar{2}0)_{Co}$, $(110)_{Cr}//(10\bar{1}1)_{Co}$, $(110)_{Cr}//(10\bar{1}0)_{Co}$, and $(112)_{Cr}//(10\bar{1}0)_{Co}$.

Also, in U.S. Pat. No. 4,652,499 it is disclosed that to improve the lattice matching between the Co-alloy and the Cr underlayer for better epitaxy, the Cr underlayer is alloyed with Vanadium (V). According to each of these methods, the Cr underlayer must be several hundred angstroms thick to establish the proper Cr texture for epitaxial growth of the Co-alloy. However, the consequence of forming such a thick Cr or Cr alloy layer is that the grain size of the Cr or Cr alloy also grows, to a size of several hundreds or possibly thousands of angstroms in diameter. Since the grain size of the Co-alloy deposited on the Cr underlayer will match the grain size of the Cr underlayer, the resulting epitaxially grown Co-alloy will also have a grain size of several hundreds to possibly thousands of angstroms in diameter. In such a case, the high intrinsic media noise at the magnetic transitions due to the large grains renders the media useless for current and future high density recording.

A method of overcoming the disadvantage of the resulting large Co-alloy grains when using a Cr or Cr alloy underlayer has been proposed by Lee et al. in "NiAl Underlayers for CoCrTa Magnetic Thin Films", IEEE Trans. Mag., vol. 30, no. 6, pp. 3951–3 (November 1994), "Effects of Cr Intermediate Layers on CoCrPt Thin Film Media on NiAl Underlayers", IEEE Trans. Mag., vol. 31, no. 6, pp. 2728–30 (November 1995), and European Patent Application Publication EP 0 704 839 A1, claiming priority from a U.S. patent application Ser. No. 08/315,096, filed Sep. 29, 1994 now U.S. Pat. No. 5,693,426. Lee et al. teach controlling grain growth by forming a Co-based magnetic alloy layer above an underlayer having a B-2 crystal texture. In one embodiment, an extremely thin Cr intermediate layer (25 to 50 Å) is deposited between a B-2 NiAl underlayer and the Co-based magnetic alloy layer.

According to Lee et al., the Co-based magnetic alloy layer is grown epitaxially on the layers below. In the embodiment in which the extremely thin Cr is employed, the Cr layer is grown epitaxially on the B-2 crystal underlayer, and the Co-based magnetic alloy is grown epitaxially on the thin Cr layer. The rationale is that the $(112)_{NiAl}$ crystal orientation of the NiAl layer, provides the basis for the Co-alloy to assume a $(10\bar{1}0)_{Co}$ orientation, resulting in the Co-alloy having an in-plane C-axis. While the Cr layer is necessary for increased coercivity and squareness, according to this prior work the Cr layer cannot interrupt the relationship between the $(112)_{NiAl}$ and the $(10\bar{1}0)_{Co}$ (i.e., the indirect epitaxy between the B2 layer and the magnetic recording material layer). Thus, Lee et al. require that the intermediate layer be extremely thin (between 25 Å and 50 Å) to prevent the Cr from developing its own preferred orientation. Relatively high coercivity and squareness (S) are reported.

Lee et al. observed an increase in coercivity and squareness, believed to be due to the $(10\bar{1}0)$ texture of the Co magnetic film, which is derived from epitaxial growth on the (112) textured thick NiAl (see the aforementioned "NiAl Underlayers for CoCrTa Magnetic Thin Films", by Lee et al.), with the thin (25 Å) Cr intermediate layer merely transferring the (112) texture to the Co. Lee et al. state that a Cr intermediate layer is required to prevent contamination of the Co by the excess Al on the NiAl film surface, and that the Cr intermediate layer must be sufficiently thin to (a) minimize diffusion of Cr into the Co film layer, and (b) avoid interference with the epitaxy between the Co alloy magnetic recording layer and the NiAl underlayer.

Despite the high coercivity, high squareness, and fine grain structure taught by Lee et al. (see EPO 704 839 A1), the mere addition of the NiAl underlayer provides only a minimal improvement in the media noise performance, and thus the resulting media is inadequate for current and future high density recording applications. With reference to EPO 704 839 A1, this minimal improvement can be seen in FIGS. 14 and 15 showing carrier noise measurement data, and FIGS. 16 and 17 showing integrated media noise measurement data. Importantly, it appears that the media taught by Lee et al. suffers from high intergranular exchange interaction, and there is no teaching by Lee et al. to address this, for example by deliberately isolating each individual grains.

We believe that the high coercivity taught by Lee et al. results from the use of a relatively large amount of platinum (e.g., 18 atomic per cent), and possibly to some degree from the $(10\bar{1}0)$ texture. As will be discussed further below, a properly isolated CoPt-based film can achieve a coercivity of over 3,000 Oe, even with less than 13 atomic per cent Pt in the alloy, if the grains in the film are properly isolated. Indeed, such a high coercivity may be produced with random orientation of grains and without a $(10\bar{1}0)$ texture. The need by Lee et al. for such a high amount of platinum, and the need for producing a $(10\bar{1}0)$ texture, together with the extremely high hysteresis loop squareness they obtain, indicate that the films taught by Lee et al. have significant intergranular exchange interaction between the physical grains. From this, and the lack of any discussion of isolation by Lee et al., one can understand why the films taught by Lee et al. do not show any significant improvement in media noise.

As previously mentioned, the effects of magnetic grain isolation are known in the art (Chen, "Physical Origin of Limits in the Performance of Thin-Film Longitudinal Recording Media," supra). Magnetic grain isolation has been successfully put into practice. See, for example, applicant's prior work described in U.S. patent application Ser. No. 08/223,636, filed Apr. 6, 1994 now abandoned. However, according to this work, an amorphous under layer is employed to provide small, uniform grains of the subsequently deposited Co-based magnetic recording layer. At the interface between the amorphous underlayer and the crystalline magnetic recording layer, the individual crystal grains of the magnetic recording layer are polycrystalline. A polycrystalline magnetic grain will have a lower magneto crystalline anisotropy constant $K_u$ than a single crystal grain. Since a part of the overall coercivity of a film is proportional to the Ku of the individual grains, given by $$Hc \propto \sum_{grains} \frac{2Ku_{(grains)}}{Ms}$$

a reduction in Ku of the Co-alloy at the interface with the amorphous underlayer results in a reduction in the coercivity of the overall magnetic recording layer. As the Mrt of the recording layer is reduced (i.e., as the recording layer gets thinner), driven for example by the aim of increasing linear recording density, the ratio of the thickness of the polycrystalline region to the total film thickness increases (and if the film is thin enough, the polycrystalline region may be the predominant film structure), and the coercivity will be drastically reduced. For example, as the Mrt of a film drops below 1 memu/cm$^2$, required for storage of over 1 Gbit/in$^2$, the drop in Hc accelerates to the point of rendering the film useless for future recording density.

Currently, there are recognized limits on the ability to obtain high coercivity, high squareness, and low media noise for low Mrt film for future high density recording without adversely sacrificing PW50, OW and TNLD. This problem has lead to compromises in the values of the magnetic performance parameters, ease and cost of manufacturing, etc., for longitudinal recording media for high recording density. Therefore, there is at present a need in the art for a method of producing media with high coercivity, high squareness, and low noise, narrow PW50, good OW, and low TNLD.

SUMMARY OF THE INVENTION

The present invention solves the problems and needs of the art by providing a magnetic recording medium, and method for manufacturing same, such medium having high coercivity and high hysteresis squareness and optimized to provide superior magnetic recording parameters such as PW50, intrinsic media noise, TNLD, and OW in high density applications. The method of manufacturing such media comprises use of specific alloys in a vacuum deposition system, and specific operating conditions and steps which yield such an optimized media.

Control of grain growth and structure is a key aspect of the present invention. Media according to the present invention are comprised of a magnetic recording layer having fine individual magnetic grains having a diameter of 100 Å or less which are isolated from one another by a solid segregant, and which have a controlled, uniform size, and spacing on the order of between 5 Å and 50 Å (ideally a mean spacing of about 10 Å). Importantly, the grains of the magnetic recording layer are principally single crystals throughout the thickness of the layer, so as to maximize the magnetocrystalline anisotropy constant of each individual grain, and furthermore, the C-axis of the grains are oriented predominantly in the plane of the film and are randomly oriented in-plane.

This media will typically exhibit coercivity squareness and remanent coercivity squareness approaching 0.8 or better, a switching field distribution approaching 0.2 or less, and a coercivity approaching that of the intrinsic coercivity of the individual grains, for example at least 2000 Oe with a minimum required Pt content, while simultaneously providing the lowest media jitter noise and TNLD, and maximum overwrite for optimum magnetic performance. The media is ideally suited for current and future high storage density applications, such as use with magneto-resistive heads. We have found that the mechanism of improved TNLD is the crystals of the magnetic grains having their C-axis oriented predominantly in the plane of the magnetic film, and the mechanism of improved OW is that each magnetic grain is predominantly a single crystal.

While it is known that small grains are a necessity to producing low noise magnetic recording media, we have also found that if the small grains are of predominantly a single crystal (i.e., crystallites) the coercivity is increased for a given platinum concentration in a Co-Pt based alloy. The single crystal grains provide the highest $K_u$ possible to support high coercivity.

We have found that to achieve high squareness with media having isolated grains, the grains should be uniform in size and uniformly spaced apart from each other for uniform switching characteristics during the magnetization reversal process. As an added benefit, the uniform switching characteristics of the grains resulting from small size and uniform spacing also provides better OW.

Thus, one aspect of the present invention is a film deposition process based on controlled grain growth through a proper nucleation process to obtain a magnetic film layer having uniformly isolated small single crystal magnetic grains (100 Å or less in diameter) of tight distribution in grain size for high density recording.

The results of our research indicate that use of a proper nucleation layer beneath the recording layer is critical to obtaining the uniform magnetic grain size and spacing necessary for high coercivity, high squareness, and low noise. The function of this layer is to provide nucleation sites on which individual physical magnetic grains will grow. The grain characteristics of the magnetic layer, including morphology (defined herein as the size and spacing of the grains) and the grain crystal orientations are significantly dictated by the conditions of the surface on which it is grown.

Since physical grains will form at nucleation sites, controlling the size of each nucleation site and the spacing between adjacent nucleation sites will provide the facility for controlling the grain growth characteristics of size and spacing of the magnetic recording layer, as well as provide large angle grain boundaries. In addition, proper control of the size and spacing of the nucleation sites provides a method for optimizing the segregation of segregant material (discussed below) at the grain boundaries in the magnetic recording layer.

Furthermore, if a crystalline nucleation layer is selected having an appropriate lattice match to the subsequently deposited magnetic recording layer for epitaxial growth of the magnetic layer, a recording layer having near single crystal magnetic grains with their C-axes oriented predominantly parallel to the film (or substrate) plane can be obtained. In addition, while the grains' C-axes are parallel to the film plane, they are also randomly oriented within the film plane, a condition we refer to as 2-dimensional isotropy. Heretofore, producing these grains with sufficiently small size has not been possible. We have discovered that the structured nucleation layer of this invention overcomes this limitation.

Accordingly, it is important to distinguish between the "under layers" of the prior art, and a "structured nucleation layer" according to the present invention. While an underlayer may be capable of providing nucleation sites, it will not create a desired, extremely fine crystalline microstructure of the magnetic film. However, a structured nucleation layer as proposed by this invention does perform each of these functions. The layers of material such as undoped NiP and elemental Cr taught by the prior art will be referred to as under layers. The laid open Japanese Patent Application 5-73880, and its EPO equivalent discussed above (Shimizu et al.) and laid open Japanese Patent Application 5-197944 (Murayama et al.) each discuss use of an underlayer, but fail to suggest or even recognize the importance of the grain growth mechanism provided by a structured nucleation layer. In fact, Shimizu et al. generally set about to form their magnetic media without use of any type of under layer and Murayama et al. focus on the addition of $SiO_2$ to the recording layer material but fail to recognize the importance of a nucleation layer.

In accordance with the present invention, the structured nucleation layer will typically be comprised of multiple film layers providing epitaxial growth of a subsequently deposited magnetic recording layer. The structured nucleation layer controls the morphology and grain orientation of subsequent layers. Specifically, the nucleation layer (a) controls grain size and grain spacing, (b) grain orientation, including providing large angle grain boundaries, and an in-plane C-axis of the grains of the subsequent layers, and (c) single crystal magnetic recording material grains. The presence of large angle grain boundaries between grains allow a segregant to diffuse to the grain boundaries and hence isolate the fine magnetic crystal grains.

The structured nucleation layer according one aspect of the present invention comprises two components. The first component is referred to herein as a "seed layer", and is deposited onto a disk substrate. The seed layer provides a template for subsequent grain growth. The second component of the structured nucleation layer is referred to herein as an "intermediate layer", and is deposited directly onto the seed layer. In one embodiment, a single intermediate layer provides a surface on which the magnetic recording layer may be epitaxially grown to control crystal morphology and orientation for obtaining fine uniform grain size and 2-dimensional isotropic media. Other embodiments comprising multiple seed and/or intermediate layers (and/or magnetic film layers) may also be employed.

As stated, the role of the seed layer is to provide a template for subsequent grain growth. It must be capable of producing grain widths of no more than 100 Å in the subsequently grown intermediate layer, as well as in a magnetic recording layer grown on the intermediate layer. That is, grain size of the magnetic recording layer must be initiated by providing discrete, small crystalline seed layer grains. These seed layer grains serve to establish the size and spacing of the crystalline grains of the intermediate layer. Ultimately, the magnetic recording layer grains grow epitaxially on the intermediate layer grains, the later providing control of grain morphology and grain crystal orientation (i.e., 2-dimensional isotropy).

As also stated, the intermediate layer provides a surface on which the magnetic recording layer may be epitaxially grown. We have found that sputtered Cr or a sputtered Cr alloy is a suitable material for the intermediate layer. Thus, the proper lattice plane orientation of Cr must be established through a selective growth process in order to provide the nucleation sites for epitaxial growth of the magnetic recording layer, e.g., a sputtered Co alloy. Therefore, the intermediate layer material is selected based on its crystal structure and relatively close (within about 10%) lattice match for certain lattice planes to the selected magnetic recording layer material.

The thickness of the intermediate layer required for establishing this preferred grain orientation texture is generally over around 80 Å and less than around 1000 Å, depending on the base pressure of the sputtering system. However, according to the prior art this presents a difficulty. If the prior art Cr layer is too thick, for example over 200 Å, the Cr grains become too large to support growth of fine Co-alloy grains of less than 100 Å in diameter.

To overcome this difficulty, the present invention proposes using the seed layer to control the Cr grain size and also assist in establishing the desired Cr crystal orientation texture. A suitable seed layer for the Cr intermediate layer can be selected from metals such as Ti, a B2 structure such as NiAl intermetallic compound, or Cr alloyed with element of limited solid solubility to the Cr, etc. Such a seed layer generally produces fine Cr grains of less than 100 Å in diameter, even at a Cr layer thickness of over several hundred angstrom. It is the very small grain sizes of the seed layer that results in production of fine Cr grains of less than 100 Å in diameter, and the random orientation of the seed layer crystallites that result in large angle grain boundaries between the Cr grains at thicknesses sufficient to result in an in-plane C-axis and 2-dimensional isotropy of the subsequently deposited hcp Co based alloy.

It will be appreciated that the seed layer may be formed of Ti, B2 structures, Cr-based alloys, or other materials, provided the seed layer grains are of sufficiently small diameter to permit the growth of small Cr intermediate layer grains. In one embodiment, the seed layer is a Cr alloy, inherently having a good lattice match to the intermediate layer of Cr. However, as will be explained, the element(s) alloyed with Cr used for seed layer should have limited solubility in Cr. Examples of such alloys are Cr—Cu, Cr—Y, Cr—Si, Cr—Pd, Cr—Hf, etc. The amount of the element(s) alloyed with Cr should be at most only a few atomic percent (e.g., up to 10 at. %) over the maximum solid solubility in the Cr matrix, so that the alloyed element can fully migrate to the Cr grain boundaries to form fine grains. Alternatively, Cr may be alloyed with more than one element with the same limitations to achieve segregation of the more than one elements at the Cr grain boundaries.

In fact, in general, when Cr is used as the seed layer, an alloy having limited solid solubility is needed because it will tend to form smaller grains for nucleation sites than pure elemental films. Thus, properly selected alloys will better facilitate extremely fine grains in the seed layer and hence the intermediate layer. But, with proper deposition techniques and selection of materials, certain elemental materials such as Ti may also provide suitably fine grains in the film deposition process since Ti is very reactive to the residual gas in the vacuum sputtering system and impurities in the sputtering target(s). Regardless, the material selected for the seed layer must have a crystal structure capable of allowing the subsequently deposited intermediate layer to assume or develop a crystallographic morphology such that the magnetic recording layer (typically a Co-based alloy) grown on the intermediate layer grows epitaxially with a similar grain morphology.

This is not to say that the morphology of the magnetic recording layer is determined by that of the seed layer. In fact in general according to the present invention it is not. While the work of Lee et al. previously discussed does have such a requirement in order to provide in-plane orientation of the magnetic recording layer, there is no such limitation according to the present invention (for example, as supported by data for Ti, Cr-3% Cu, and Cr-5% Cu seed layers described below).

The randomly oriented seed layer allows the subsequently deposited intermediate layer to grow and take on its own morphology, starting with the size and location of the nucleation sites from the seed layer. The resulting intermediate layer will establish certain preferred orientations, facilitating subsequent epitaxial growth of magnetic grains having in-plane C-axes. Indeed, the magnetic grains grow with random in-plane orientations, resulting in large angle grain boundaries. This greatly enhances the diffusion of segregant material to the magnetic grain boundaries, providing suppression of exchange interaction between grains and hence reduced noise.

The intermediate layer is preferably elemental Cr, due to its close lattice match of several crystallographic planes to certain of the lattice planes of the Co-based magnetic recording layer. However, other intermediate layer elements or alloys may work equally well as an intermediate layer allowing epitaxial growth of a Co-based recording layer. In fact, the magnetic recording layer may be other than a Co-based alloy, and so have a different lattice constant. In such a case, other intermediate layers for appropriate lattice matching may be employed. Thus, the present invention should not be read to be limited to a Cr intermediate layer (or limited to a Co-based magnetic recording layer).

This invention provides the desired fine, uniform grains while still allowing the Cr intermediate layer to form sufficiently thick to develop its preferred orientations for subsequently deposited Co-alloy epitaxy. In fact, as compared to the prior art employing a Cr underlayer, smaller grains are achieved even at comparatively large Cr layer thicknesses. Furthermore, as compared to the prior art which relies on use of a thick NiAl underlayer to obtain a Co-alloy having its C-axis parallel to the plane of the substrate (e.g., Lee et al.), the grains of the media taught by this invention are smaller due to the use of a seed layer, and an in-plane C-axis is obtained through matching planes of the magnetic recording layer with the preferred textures of the intermediate layer.

Importantly, this invention provides a homogenous crystallographic morphology throughout the magnetic recording layer. That is, with a structured nucleation layer lattice-matched to a magnetic recording layer, the magnetic recording layer grains form more perfect single crystals at the interface of the magnetic recording layer and the intermediate layer. Hence, each grain of the magnetic recording layer will be nearly a single crystal. This is to be contrasted with a polycrystalline grain of a magnetic layer formed on an amorphous underlayer, a non-lattice matched under layer, and a non structured nucleation layer. Consequently, the magnetocrystalline anisotropy constant of the magnetic recording layer material approaches that of the intrinsic magnetocrystalline anisotropy constant of the individual grains. And thus, the coercivity of the magnetic recording layer material is increased, even when Mrt is decreased to e.g. less than 0.6 memu/cm$^2$. In addition, the more perfect resultant lattice structure of the magnetic recording layer allows a more uniform magnetization switching, which we believe is responsible for our discovery of an increase in overwrite.

The magnetic recording medium of the present invention is manufactured by depositing a nonmagnetic segregant material, such as an oxide or nitride of one or more of Al, As, B, Ce, Co, Cr, Dy, Gd, Ho, La, Lu, Ni, Os, Pm, Ru, Re, Sc, Se, Si, Sm, Sn, Ta, Tb, Th, Ti, Tm, U, V, W, Y, or Zr, together with the magnetic material. In a single deposition step, without post deposition treatment, the segregant material must uniformly diffuse to the grain boundaries even at ambient substrate temperature to provide sufficient isolation between grains without adversely affecting the intrinsic magnetic properties such as magnetization and coercivity.

This must occur under moderate deposition rates (e.g., at least 1 Å/sec. but less than 20 Å/sec.) and at a relatively low temperature ($\leq 200°$ C.). In order to accomplish this, the segregant material selected is insoluble in the magnetic alloy, and is thermodynamically stable. The stability of the segregant material is determined by its bond strength, which should be at least 90 Kcal/mol. In other embodiments, the segregant may be a metal or metal alloy which has a good diffusion rate in a low temperature sputtering environment (e.g., below 200° C.) to establish a good grain boundary segregation can also be used.

While the concentration of the segregant material in the deposited media must be sufficient to completely separate each individual magnetic grain at the grain boundaries (thereby minimizing media noise from intergranular exchange coupling), there is an upper limit to the amount of segregant which can be incorporated in the magnetic film. This upper limit is a function of the decrease in coercivity, a decrease in saturation magnetization, and/or squareness caused by the addition of segregant material. Typically, a target coercivity and/or squareness will be identified, and the amount of segregant will be selected such that the coercivity and/or squareness are maintained at or above their target values. Typically, the amount of segregant material added will be at about or below 10 molar percent (mol. %). The effects of the introduction of the segregant may be greatly enhanced by employing the aforementioned structured nucleation layer under the magnetic layer.

We have found that in order for the segregant to be effectively segregated at the grain boundaries in a dry sputtering environment and low argon pressure, the deposited magnetic film must be provided with large grain angle boundaries at an initial stage of grain growth. Selection of the proper structured nucleation layer provides the requisite large grain boundaries, while simultaneously providing uniform grain size and grain spacing. Therefore, growth of the magnetic recording layer on an appropriate structured nucleation layer is critical to (a) facilitate the introduction of segregant at the grain boundaries, (b) control the grain size, (c) control the grain spacing in the magnetic recording layer, and (d) control the orientation of the crystal grains.

Addition of the segregant material has a minimal impact on the magnetic layer's saturation magnetization Ms and magnetic remanence Mr. High remanent squareness is achieved, and hence there is minimal impact on the overall thickness of the magnetic layer. Importantly, exchange coupling induced noise can be completely suppressed by the introduction of the segregant material and other steps of the present invention. Simultaneously, a high coercivity, for example 2000 Oe or greater, and high coercivity squareness and remanent coercivity squareness, for example approaching 0.8 or more each, are obtained.

We have also discovered that in order to achieve good epitaxy between the intermediate layer and the magnetic layer, the background H$_2$O pressure during sputtering must be less than about $1 \times 10^{-6}$ Torr, and other residual gas pressures must also be low. Furthermore, we have found that in order to achieve a good epitaxy between the intermediate layer and magnetic layer, contamination on the surface of the deposited intermediate layer must be minimized before the magnetic layer is deposited. To prevent such contamination, we have discovered that the magnetic layer must be deposited as soon as possible after the intermediate layer is deposited, and it is preferable that the time between finishing deposition of the intermediate layer and deposition of the subsequent layer is e.g. 60 seconds or less depending on the base pressure of the sputtering system.

Therefore, a greatly improved media best suited for high density recording applications is provided by sputtering a magnetic recording layer containing a segregant material onto an appropriately selected multilayer crystalline structured nucleation layer. The resulting magnetic layer exhibits predominantly single crystallite grains of small and uniform size which are uniformly spaced apart from one another by the segregant material at the grain boundaries, and have their C-axis predominantly parallel to, and randomly oriented in, the plane of the substrate. The method of the present invention provides control over the resulting media's recording performance characteristics, and adds little additional complexity or cost to an existing sputtering process.

BRIEF DESCRIPTION OF THE DRAWINGS

The present invention will be described in greater detail below, including specific examples thereof, with regard to the figures, in which:

FIG. 1 is a cross section of a rigid thin-film magnetic disk constructed in accordance with the present invention.

FIG. 2 is an illustration of the cross section of a rigid magnetic recording medium according to one embodiment of the present invention.

FIG. 3 is a plan-view illustration of a section of the magnetic recording layer according to the present invention.

FIGS. 4 and 5 are micrograph cross-sections of media according to the present invention, showing the epitaxial relationship between the Cr intermediate layer grains and the Co-Pt alloy magnetic recording layer grains.

FIGS. 6 are TEM images of a Co-Pt alloy magnetic recording layer according to the present invention taken normal to the film plane.

FIG. 7 is a high resolution SEM micrograph image of the fracture cross sectional surface of a multilayer disk structure of a 150 Å NiAl seed layer, a 600 Å Cr intermediate layer, and a 200 Å $CoCr_{0.12}Pt_{0.12}$+8 mol. % $SiO_2$ magnetic recording layer with a 100 Å carbon overcoat according to the present invention.

FIG. 8 is a high resolution SEM image taken on a fracture surface similar to that of FIG. 7, except that the disk is a multilayer structure of 150 Å NiP+2% $Al_2O_3$ underlayer followed by a 600 Å Cr layer, which in turn is followed by a 200 Å $CoCr_{0.12}Pt_{0.12}$+6 mol. % $SiO_2$ film layer and 100 Å carbon overcoat.

FIG. 9 is a graph comparing the Mrt versus Hcr for two different recording media: the first having a 150 Å thick underlayer of amorphous NiP+2% $Al_2O_3$ on which a $CoCr_{0.12}Pt_{0.12}$+8 mol. % $SiO_2$ magnetic recording layer is formed, the second having a 600 Å thick crystalline Cr underlayer on which the same magnetic recording layer is formed.

FIG. 10 is a plot of Hcr versus Mrt for two media, the first having a the Cr underlayer 200 Å thick, the second having a Cr underlayer 600 Å thick both with and without a NiAl seed layer.

FIG. 11 is a plot of Hcr versus seed layer thickness, comparing the results for a seed layer of NiAl and a seed layer of Ti.

FIG. 12 is a plot of Hcr versus Mrt for three media, the first with a 600 Å thick Cr layer directly on the substrate, the second for a structured nucleation layer consisting of a 100 Å thick NiAl seed layer and a 600 Å thick Cr intermediate layer, and third for a structured nucleation layer consisting of a 100 Å thick Ti seed layer and a 600 Å thick Cr intermediate layer.

FIG. 13 is a plot of Hcr versus Mrt for media having a Cr underlayer deposited directly on a substrate, having a NiAl and Cr structured nucleation layer, and two media having a Cr—Cu and Cr structured nucleation, in one case Cr-3% Cu, and the other case Cr-5% Cu.

FIGS. 14a, 14b, 15a, 15b, 16a, and 16b show TEM cross sections, under identical magnification, of disks 2, 3, and 4 of Table II, respectively.

FIG. 17 is a plot of Normalized Integrated Media Noise Poser versus Linear Recording Density for several media of the prior art and the present invention.

FIG. 18 is a plot of Non-Linear Distortion versus Linear Recording Density for several media of the prior art and the present invention.

FIG. 19 is an illustration of a disk drive incorporating a magnetic recording medium according to the present invention.

As between each of these figures, like reference numerals shall denote like elements.

DETAILED DESCRIPTION

FIG. 1 is a cross section (not to scale) of a typical rigid thin-film magnetic disk 10 constructed in accordance with the present invention. A general description of the complete disk 10 will be presented below, followed by a detailed description of certain of the layers thereof and the methods and conditions for their deposition. Finally, a detailed description of several examples will be presented to highlight various of the important aspects of the present invention.

Disk 10 consists of an aluminum alloy substrate 12. Substrate 12 may be an aluminum blank onto which a plated layer (not shown), typically of NiP, is formed by electroless plating or other methods well known in the art. Alternatively, substrate 12 may be glass, ceramic, glass-ceramic, carbon-based materials, silicon, titanium, stainless steel, or other appropriate material selected for reasons beyond the scope of this invention. Importantly, however, the uppermost surface of substrate 12 (from the perspective of FIG. 1) is smooth and well cleaned. Optionally, the surface may be textured to improve the CSS performance of the resulting magnetic storage medium, as well known in the art.

A structured nucleation layer 14, described in further detail below, is then deposited onto substrate 12. Structured nucleation layer 14 may comprise two or more sublayers, as shown in FIG. 2. In the case of two sublayers, the first such structured nucleation sublayer is referred to herein as the seed layer 22, and the second such nucleation sublayer is referred to herein as the intermediate layer 24. Sputtering is the preferred method of depositing structured nucleation layer 14 (i.e., each of its sublayers), although other methods of deposition may accomplish the desired goal of formation of one or more of these sublayers.

Returning to FIG. 1, a magnetic recording layer 16 comprising a magnetic alloy and an insoluble "stable" segregant material, described in further detail below, is then deposited on structured nucleation layer 14. Again, sputtering is a preferred method for deposition of this layer, although other techniques are available to accomplish the goal of deposition of this layer.

A protective over layer 18 of a type known in the art, e.g., of carbon doped with nitrogen, hydrogen or both or oxides such as $ZrO_2$, $SiO_2$, etc., or nitrides such as TiN, ZrN, etc., or carbides such as TiC, SiC, etc., of a thickness for example less than 300 Å, and a lubricant layer 20 of a type known in the art, are applied over magnetic recording layer 16. Details of the protective over layer 18 and lubricant layer 20 are beyond the scope of the present invention, and therefore are not discussed in detail herein.

In order to achieve the specific goals of the present invention, a CoPt-based magnetic alloy is deposited together with an insoluble segregant material. In one embodiment, the CoPt is alloyed with Cr. In this embodiment, the chrome concentration is up to about 15 at. %, and the cobalt concentration is greater than about 75 at. %.

As has been described, a primary source of media noise is intergranular exchange coupling. As discussed by Chen et al. in the aforementioned "Physical Origin of Limits in the Performance of Thin-Film Longitudinal Recording Media," one method of reducing coupling noise is to isolate the grains of the recording layer from one another. This is the role of the insoluble segregant material. Various materials, such as oxides and nitrides of Al, As, B, Ce, Co, Cr, Dy, Gd, Ho, La, Lu, Ni, Os, Pm, Ru, Re, Sc, Se, Si, Sm, Sn, Ta, Tb, Th, Ti, Tm, U, V, W, Y, and Zr are effective for grain isolation. The selection criteria for the segregant material is that firstly, it should be relatively insoluble in the magnetic alloy such that it segregates to the grain boundaries, and secondly, it should be stable as determined by the binding energy of the compound which should be greater than at least 90 Kcal/mol. for $D°_{298}$ (as described in the Handbook of Chemistry and Physics, 69th ed., CRC Press, 1988–89). It should be noted that in the following description and associated figures, $SiO_2$, is used as an example of the insoluble "stable" segregant. For a more detailed discussion of $SiO_2$, and other related segregant materials, see the aforementioned U.S. patent application Ser. No. 08/286,653 now U.S. Pat. No. 5,658,659. However, one or more of many such insoluble "stable" segregants are within the contemplation of the present invention.

As previously stated, optimal recording performance may be obtained when the grains comprising the recording layer are uniform in size and uniformly spaced apart by segregant material. In fact, we have found that it is extremely important that each of the magnetic grains 78 should be a single crystallite of nearly identical size, uniformly isolated from one another by insulating material 80 to break intergranular exchange. A section of a magnetic recording layer with this arrangement is illustrated in plan view in FIG. 3 (the in-plane or 2-dimensional random grain orientations illustrated by the parallel lines within the each grain boundary). For future high density recording applications, for example 1 Gb/in$^2$, the maximum allowable write jitter is expected to be on the order of 4 nm or less. We believe that grain size of media for such applications will be as small as 100 Å or smaller.

Thus, we have discovered that in order to achieve performance targets for such media, the individual grains 78 must be uniformly isolated by about 10 Å of insulating material 80 to completely eliminate the exchange interaction yet support the highest write density. Media having such a recording layer will exhibit the highest possible squareness while maintaining the lowest possible media noise, as required for future high recording density applications.

It should be noted that there is a tradeoff between squareness and noise. An extremely square media is obtainable by disregarding intergranular exchange coupling, and providing closely packed fine grains without segregant. However, this will severely affect the usefulness of the media, and is not commercially practical given the current and anticipated future expectations for magnetic recording media performance parameters. At the other extreme, intergranular exchange coupling can be completely eliminated by highly isolating the particles with spacing of several 10's of angstroms of insulating material 80. However, in that case, the excessive non magnetic insulating material will dilute the magnetic layer too much and hence reduce the volume magnetization of the film as well as reduce the squareness of the film due to excessive reduction of magnetostatic interaction between grains. Thus, a balance is needed between high squareness, highest volume magnetization and lowest noise performance obtainable by grain segregation in determining the amount of isolation, and hence quantity of the segregant, used in the magnetic alloy formation. The general rule is to select a sufficient amount of segregant to completely isolate the grains from each other but not so much as to cause degradation of magnetic performance of the film. In principle, a separation of about 10 Å between the grains by the non-magnetic segregant is sufficient to cause suppression of exchange interaction.

We have discovered that one requirement for obtaining a superior recording layer is that the recording layer be formed on a proper structured nucleation layer. A structured nucleation layer affects the size and spacing of the magnetic grains formed thereupon, and facilitates the uniform distribution of the segregant between the grains to provide the necessary isolation to minimize or prevent intergranular exchange coupling for reduced noise and improved magnetic performance. To accomplish this, the structured nucleation layer should have a topology of discrete nucleation sites to which individual grains will adhere.

Therefore, the structured nucleation layer should be sufficiently thick (for example, about 100 Å or thicker for each sublayer) to uniformly and completely cover the substrate surface to eliminate the effects of the underlying substrate surface texture and establish a new crystal morphology for subsequent crystal growth; yet, it should not be so thick as to cause the degradation of the desired grain size, distribution, and uniform separation provided by the nucleation sites. A cross section of such a microstructure of a magnetic disk according to one embodiment of the present invention is schematically shown in FIG. 2, in which structured nucleation layer 14 consists of seed layer 22 and intermediate layer 24. Seed layer 22 consists of randomly oriented discrete grains 74, which serve as a template for Cr grains 76 to nucleate and grow.

Importantly, grains 74 are very small, e.g. much smaller than 100 Å in diameter (as viewed perpendicular to the plane of the substrate), and are contiguous. Also, each grain's crystal orientation is randomly oriented relative to one another, so that there are large angle grain boundaries between adjacent grains. These features are a function of the material used for seed layer 22. For example, it has been found that HCP elements such as Ti, BCC alloys such as Cr—Cu, and B2 phase NiAl produce these features under the proper vacuum sputtering deposition conditions.

Intermediate layer 24 is subsequently deposited directly onto seed layer 22. Intermediate layer 24 is typically Cr or a Cr-alloy, which has a reasonably good lattice match to a Co-Pt based alloy used for the magnetic recording layer. Table I shows the lattice mismatch for the planes of a Cr intermediate layer and a magnetic recording layer comprising Co(72%)Cr(10%)Pt(18%) (in general, the percentages of each element shall be denoted herein as a decimal place subscript, and the percentage of an element with no subscript shall constitute the balance of the alloy, e.g. $CoCr_{0.10}Pt_{0.18}$).

TABLE I

Lattice mismatch for various planes of Cr and CoCr$_{.10}$Pt$_{.18}$

| Cr texture | CoCr$_{.10}$Pt$_{.18}$ texture | Mismatch | c-axis |
|---|---|---|---|
| (110) | (10$\bar{1}$1) | 0.2% and 2%) | 28° out of plane |
| (110) | (10$\bar{1}$0) | 1.7% and 11% | in plane |
| (200) | (11$\bar{2}$0) | 1.7% and 9% | in plane |
| (211) | (10$\bar{1}$0) | 1.7% and 2% | in plane |
| (111) | ($\bar{3}$120) | 1.7% and 4% | in plane |
| (221) | (10$\bar{1}$0) | 1.7% and 4% | in plane |
| (210) | no good match in either direction | | |

As shown in Table I, the lattice mismatch between the CoCr$_{0.10}$Pt$_{0.18}$ alloy and the Cr underlayer is about 10% or less in both lattice plane directions, and hence epitaxial growth of the CoCr$_{0.10}$Pt$_{0.18}$ on Cr can be easily established. (Generally speaking, the Cr concentration used in the CoCrPt alloy is maintain between 10% and 15% for improving corrosion resistance, and the Pt concentration is maintained between 10% and 18% for increased $K_u$ and hence Hc, while it is at the same time desirable to minimize the concentration of Pt to reduce cost and increase the intrinsic saturation moment, Ms, of the alloy.) As also shown in Table I, the resultant texture of the Co-alloy has in-plane C-axis orientation except for (10$\bar{1}$1)$_{Co}$ on (110)$_{Cr}$ which has its C-axis oriented 28 degrees out of the plane of the film. To enhance the large crystallographic grain angles between the grains, the film should have many different Co-alloy textures mixed in the film. Ideally, the (10$\bar{1}$1)$_{Co}$ texture should be present together with other in plane texture grains to enhance large angle grain boundaries between the grains.

According to one embodiment of the present invention, we have found that a Cr intermediate layer having predominantly the Cr textures shown in Table I results when forming intermediate layer 24 on a seed layer of Ti or NiAl. The common morphology between the Cr grains and the Co-alloy grains can be seen in the micrograph of FIG. 4, showing a NiAl seed layer having a Cr intermediate layer formed thereon, and a Co-based alloy layer formed on the Cr intermediate layer.

While multiple crystal orientations are present in the seed layer, and while the Cr grains will nucleate and grow on the seed layer grains, the Cr will prefer to form in a series of textures having a low energy, such as one or more of (110), (200), (211), (111), and (221). Cr grains growing with other orientations will tend to grow more slowly and will be overrun by the lower energy orientations. This is schematically illustrated in FIG. 2.

In addition, as the grains with the preferred orientations overrun the grains having other orientations, they will tend to impinge against one another, and hence confine the Cr grains to grow only in the thickness direction (and not the film plane direction). This effectively maintains the small grain diameter up to the interface with the Co-alloy grains. This is well illustrated in FIG. 4. Since the seed layer 22 provides a very large number of nucleation sites for the Cr grains to nucleate and grow, statistically there results a large number Cr grains having a preferred orientation. Hence the Cr grains having a preferred orientation grow relatively close together. This, combined with the fact that these grains will grow at a fairly uniform rate, provides an ideal limitation on the tendency of the Cr grains to grow in diameter. This can be seen and verified in layer 24 of FIG. 4.

FIG. 4 and 5 are micrographs confirming that the subsequently deposited Co-based alloy layer will develop a crystal morphology and orientation more or less following that of the Cr intermediate layer on which it is deposited. The epitaxial growth of the Co-based alloy on the Cr intermediate layer can be confirmed by observing the continuation of the lattice plane orientation of the Cr intermediate layer in the magnetic recording layer 16 shown in FIG. 4.

FIG. 6 is a TEM image of the Co-alloy film taken normal to the film plane. As shown in FIG. 6, the Co-alloy grains 78 are completely isolated from each other and surrounded by the segregant 80 (SiO$_2$). As also shown, the grain size of the Co-alloy crystals is quite uniform and less than 100 Å, and the mean spacing of the insulating segregant is about 10 Å. The good isolation of the magnetic grains and the small grain sizes of the film ensure the minimum intrinsic noise of the media (by completely suppressing the magnetic exchange interaction and minimizing the grain size induced transition noise).

FIG. 7 is a high resolution SEM micrograph image of the fracture cross sectional surface of a multi-layer film disk of 200 Å CoCr$_{0.12}$Pt$_{0.12}$+8% SiO$_2$ film deposited on a 600 Å Cr intermediate layer formed over a 150 Å NiAl seed layer. The uppermost layer is a 100 Å carbon overcoat. As demonstrated in the micrograph, the fracture surface of this multilayer structure film using the proposed structured nucleation layer shows a well defined column of grains with clean cut grain boundaries which start near the substrate surface and extend to the film surface. These results confirm that the grains are well isolated. In comparison, FIG. 8 is the SEM image taken on a similarly fractured surface of a multilayer film structure of 150 Å NiP+2% Al$_2$O$_3$ underlayer followed by a 600 Å Cr layer, which in turn is followed by a 200 Å CoCr$_{0.12}$Pt$_{0.12}$+8% SiO$_2$ film layer and 100 Å carbon overcoat. FIG. 8 shows that the columns of grains are poorly defined, and have intragrain fractures within the Cr and Co-alloy layers, particularly at or below the middle of the Co-alloy layer, and the fracture of the grain is not clean. These results show that the amorphous structure of NiP+2% Al$_2$O$_3$ cannot provide a good nucleation site (or template) for Cr, and results in Cr grains growing excessively large. In this later case, the Co grains grown on the Cr grains would have small grain angle boundaries, and hence insufficient isolation, and would not have a randomly oriented in-plane C-axis (i.e., would not have 2-dimensional isotropy) even given the epitaxial growth of those grains.

We have discovered that a properly selected element or alloy having a suitable lattice structure and/or crystal structure, such as Ti, B2 structure (e.g., NiAl), Cr—X alloy (where X is a limited solid solubility element, for example Cu in an amount marginally above the solid solubility of Cu—Cr), etc. can be used as the fine grain seed layer providing the preferred morphology and orientation of the crystals in the Cr intermediate layer, which in turn provides morphology and orientation for epitaxial growth of the Co-alloy.

According to one aspect of the present invention, the seed layer and subsequent layers are deposited at or near ambient temperature and at a relatively high rate. It is commonly known that a higher substrate temperature and a lower deposition rate will result in larger grains.

As has been stated, it is one goal of the present invention to produce a fine grain seed layer. We have found that the selection of material for the seed layer plays a large role in achieving this goal. For example, Ti may be preferred because it is very reactive to residual oxygen or nitrogen gas in the sputtering atmosphere or in the sputtering target (it is very difficult to produce a high purity Ti target), forming an oxide or nitride at the grain boundary to thereby produce extremely fine grains. A Cr-alloy with limited solid solubility may also be preferred, since the amount of the alloying element beyond solid solubility segregates to the grain boundaries and hence facilitates the fine grain formation. In a relatively high deposition rate and low temperature application, B2 phase compounds such as NiAl can also form very fine grains due to the nature of the non-stoichiometric composition of the compound and the difficulty of achieving an equilibrium phase structure (B2 structure single phase) in such a relatively high deposition rate, low deposition temperature system (i.e. insufficient kinetics of diffusion to achieve equilibrium in the deposition process).

The present invention is a unique magnetic recording medium and method of forming same. It relies on a unique nucleation layer structure and selection of materials for said layer, together with a magnetic alloy employing a selected segregant material. A magnetic recording layer is ultimately provided having fine grains (100 Å or less) and large angle grain boundaries to promote segregation of the selected segregant to the grain boundaries (to completely isolate the magnetic grains), as well as near perfect single crystal grains with in-plane C-axes. The method as taught is practical and low cost, in part based on the ability to use ambient or near ambient temperature sputtering. Based on the description contained herein, it is within the scope of one skilled in the art to compile a list of material in addition to those expressly discussed, suitable as a seed layer and as an intermediate layer to achieve a magnetic recording layer with the desired attributes. However, other deposition processes, such as high temperature sputtering, can also be employed.

The magnetic properties and recording performance of several disks prepared with various underlayers and nucleation layers according to the present invention will next be described. Unless otherwise stated, all disks discussed herein were made using a batch vacuum deposition system, model SPC-350, manufacture by Anelva Inc., Tokyo, Japan. The system consists of four sputtering cathodes. A load lock system for input and output of substrates into the sputtering chamber is used to minimize the contamination caused by the introduction of residual gasses (e.g., water vapor, oxygen, nitrogen, etc.) from the ambient atmosphere during transfer of substrates into the sputtering chamber.

To minimize the initial residual gasses within the system, particularly water vapor, the base pressure of the system was pumped down to below $2 \times 10^{-7}$ Torr before the deposition of the nucleation and magnetic layers (as well as carbon overcoat). The four sputtering cathodes are for deposition of the seed, nucleation, magnetic, and carbon overcoat layers, consecutively.

A number of disks were prepared, both without a seed layer, and with different seed layer materials: NiAl, Ti, and Cr—Cu. Each seed layer was deposited via R.F. diode sputtering. A Cr layer, which in one case was formed without an underlying seed layer, and in other cases where it formed an intermediate layer formed on a seed layer, was deposited using R.F. magnetron sputtering. The magnetic layer was deposited by R.F. diode sputtering. Finally, the carbon overcoat was deposited by D.C. magnetron sputtering.

The sputter deposition of all the layers except carbon occurred at 15 mTorr argon pressure. The carbon overcoats were deposited at 4 mTorr argon pressure. (While these were the deposition techniques and parameters for the following experiments, it will be appreciated that other techniques and parameters may be employed with similar results. For example, the Cr layer referred to herein may be deposited by R.F. diode sputtering, etc.)

FIG. 9 is a comparison of the product of the magnetic remanence and magnetic film thickness (Mrt) versus remanant coercivity (Hcr) for two different recording media: the first having a 150 Å thick underlayer of amorphous NiP+2% $Al_2O_3$ on which a $CoCr_{0.12}Pt_{0.12}$+8 mol. % $SiO_2$ magnetic recording layer is formed, the second having a 600 Å thick crystalline Cr underlayer on which the same magnetic recording layer is formed. In both cases, a substantially identical conventional carbon overcoat was applied over the magnetic recording layer.

FIG. 9 illustrates that for the amorphous NiP underlayer media, the coercivity falls off rapidly as the thickness of the Co film drops, below an Mrt of about 0.8 memu/cm². However, for the crystalline Cr underlayer media, the coercivity remains relatively flat in the same range, below about 0.8 memu/cm². In addition, the remanant coercivity of the Cr underlayer medium is higher than that of the NiP underlayer medium for any Mrt in the range of this experiment.

These results suggest that when a thick Cr underlayer is used, good epitaxy and hence growth of predominantly single crystal grains of Co alloy commence at the onset of the Co film's growth. In addition, the orientation of the Co-alloy grains is nearly in plane from the start, as predicted by Hono et. al. and U.S. Pat. No. 4,652,499. Whereas, when an amorphous NiP underlayer is used, a polycrystalline structure grows at the onset of the Co grain growth, and such a polycrystalline structure may continue up to 0.8 memu/cm².

FIG. 10 is a plot of Hcr versus Mrt for two media, each prepared with a single Cr underlayer. In one case, the Cr underlayer was 200 Å thick, in the second case the Cr underlayer was 600 Å thick. Also shown in FIG. 10 is Hcr and Mrt data for two media employing a 300 Å and a 100 Å crystalline NiAl seed layer on which a Cr intermediate layer of 200 Å and 600 Å, respectively, are deposited. In all cases, the substrate was highly polished prior to deposition of the underlayer (e.g., $R_a \approx 10$ Å). The magnetic alloy layer is the same between each of the disks (and the same as that used in the experiment of FIG. 9), namely $CoCr_{0.12}Pt_{0.12}$+8 mol. % $SiO_2$. In each case, a 100 Å thick carbon overcoat was applied over the magnetic layer.

First, FIG. 10 illustrates that a thicker Cr underlayer produces higher coercivity for a given Mrt as compared to a thinner Cr underlayer. This can be seen when comparing the cases of 200 Å and 600 Å Cr formed directly on the substrate, and when comparing the cases of 200 Å and 600 Å of Cr formed on NiAl. We hypothesize that better epitaxy is obtained when the Cr layer is thicker, e.g., when the Cr grains have a more uniform crystal structure (Cr grain size and hence Co-alloy grain size may also be affected).

Second, FIG. 10 illustrates that the addition of a crystalline NiAl seed layer under a Cr intermediate layer increases the Hcr of the resulting media. For example, above approximately 0.3 memu/cm², Hcr for the NiAl/Cr(200 Å)/$CoCr_{0.12}Pt_{0.12}$+8 mol. % $SiO_2$/C is greater at all Mrts than Cr(200 Å)/$CoCr_{0.12}Pt_{0.12}$+8 MOL. % $SiO_2$/C. This is also true for the medium having a 600 Å thick Cr layer.

Finally, comparing FIGS. 9 and 10, it can be seen that the drop off in Hcr is less dramatic when a Cr layer is employed (FIG. 10) than when no Cr layer is employed (FIG. 9). Indeed, Hcr remains in the practical range of above 1800 Oe, even with an Mrt as low as 0.3 memu/cm². Again, we believe that this is a consequence of the magnetic recording layer having good epitaxial growth at the onset of deposition and establishment of grains with a well defined single crystal with near (or predominantly) in-plane C-axis orientation (as the result of epitaxy on Cr provided by the lattice match of Table I).

FIG. 11 is a plot of Hcr versus seed layer thickness, comparing the results for a seed layer of NiAl and a seed layer of Ti. Two different Cr intermediate layer thickness (namely 200 Å and 600 Å) were used for comparison. The magnetic recording layer alloy is identical to that used in the examples of FIGS. 9 and 10, namely $CoCr_{0.12}Pt_{0.12}$+8 mol. % $SiO_2$, and was approximately 200 Å thick. The Mrt was maintained at 0.6 memu/cm$^2$.

The data of FIG. 11 is consistent with the data of FIG. 10 in that a thicker Cr intermediate layer provides a higher Hcr for given seed layer thickness. Furthermore, the curves of Hcr versus seed layer thickness for Ti and NiAl are more or less identical in shape, which indicates that a Ti seed layer, in addition to a NiAl seed layer, can provide a good platform for growth of the Cr intermediate layer for the ultimate epitaxial growth of the magnetic recording layer.

FIG. 11 also shows that using either a NiAl or a Ti seed layer provides relatively stable Hcr across a range of seed layer thicknesses. It will be appreciated that current competitive disk drive systems require media coercivities at or above 2000 Oe, which is provided at thicknesses of NiAl and Ti seed layers up to 600 Å thick. (It should also be noted that this demonstrates that the thickness of the seed layer need only be sufficient to cover the substrate surface, for example around 100 Å, and from the point of view of the function of the seed layer, there is really no technical limitation on growing of a thicker layer.

The performance similarities between media having a NiAl seed layer and a Ti seed layer (from the epitaxial growth) is also verified by the experimental data shown in FIG. 12. For the data of FIG. 12, three different media were prepared. First, a 600 Å thick Cr layer was deposited directly onto a super polished substrate. A $CoCr_{0.12}Pt_{0.12}$+8 MOL. % $SiO_2$ magnetic recording layer was deposited onto the Cr underlayer, and a 100 Å carbon overlayer was deposited onto the magnetic recording layer. Second, a 100 Å NiAl seed layer was deposited onto a super polished substrate. A 600 Å Cr intermediate layer was then deposited onto the NiAl seed layer. A $CoCr_{0.12}Pt_{0.12}$+8 MOL. % $SiO_2$ magnetic recording layer was next deposited. And finally a 100 Å carbon overcoat was deposited onto the magnetic recording layer. Third, a 100 Å Ti seed layer was substituted for the 100 Å NiAl seed layer of the second media.

FIG. 12 shows that the dependence of Hcr on Mrt for media using a 100 Å NiAl seed layer on a 600 Å Cr intermediate layer is nearly identical to that of media using a 100 Å Ti seed layer on a 600 Å Cr intermediate layer. This is made clear when one compares these results to the results obtained for media having the 600 Å Cr layer formed directly on the substrate, without a seed layer. FIG. 12 also illustrates that the value of Hcr for media using a Ti seed layer is about 200 Oe lower than that of media using a NiAl seed layer for a given Mrt. However, media using either a NiAl seed layer or a Ti seed layer can provide Hcr over 2300 Oe with an Mrt as low as 0.3 memu/cm$^2$, based on the good epitaxy between the Co alloy magnetic recording layer and the Cr intermediate layer.

In another embodiment, an alloy of Cr and Cu is employed as the seed layer. The data of FIG. 13 illustrates two examples of a Cr—Cu alloy, first 5 at. % Cu, and second 3 at. % Cu. This film is produced using a specially manufactured batch vacuum deposition system consisting of 3 cathodes. The first cathode is for R.F. magnetron sputtering of the seed layer. The second cathode is for R.F. magnetron sputtering the intermediate layer. And, the third cathode is for R.F. diode sputtering the magnetic layer. Sputtering was conducted at better than $1 \times 10^{-6}$ Torr. As previously stated, the amount of the alloying component is selected to be just over the maximum solid solubility of that component in Cr. In this case, the maximum solid solubility of Cu in Cr is about 1 at. %, as reported in Binary Alloy Phase Diagrams, ASM, 1968, page 819–820.

For the experiment of FIG. 13, each of the two disks were prepared by first depositing a 200 Å thick layer of the Cr—Cu alloy. A 600 Å Cr layer was then applied. A Co alloy consisting of $CoCr_{0.08}Pt_{0.10}$+5 mol. % $SiO_2$ was next deposited. For comparison, a disk having a 200 Å NiAl seed layer on which a 600 Å Cr layer was formed was prepared and tested. As shown in FIG. 13, the curve of Hcr versus Mrt for the disks having the Cr—Cu seed layer is similar in shape to the curves for the NiAl seed layer and for the Cr underlayer, even at small Mrt. This demonstrates that a Cr—Cu alloy having a Cu concentration slightly higher than maximum solid solubility (e.g., ≈1 at. %) can also be used as a seed layer.

The good epitaxy between Co alloy and Cr using various seed layers as proposed herein can be inferred by comparing the data of FIG. 9 to that of FIG. 13. However, the desired fine grain-size structure and good isolation between the magnetic grains obtained using the various seed layers described herein can only be verified by measuring the magnetic performance of disks with various seed layers, and comparing the result of magnetic measurements to those of disks using a Cr underlayer and disks using a NiP underlayer. The results of these magnetic measurements are shown in Table II and Table III below.

TABLE II

DISK DATA

| Disk | Amplitude | | | Resolution (%) | PW50 (ns) | OW (dB) | Wrt Jtr (nm) | TNLD (%) |
| | High Freq. (mVpp) | Mid Freq. (mVpp) | Low Freq. (mVpp) | | | | | |
| --- | --- | --- | --- | --- | --- | --- | --- | --- |
| 1 | 0.1312 | 0.6097 | 0.8800 | 14.91 | 24.45 | 29.60 | 3.80 | 16.26 |
| 2 | 0.2040 | 0.7645 | 1.0409 | 19.59 | 23.43 | 38.72 | 5.41 | 10.36 |
| 3 | 0.1961 | 0.7829 | 1.0407 | 18.84 | 22.22 | 36.64 | 2.98 | 11.98 |
| 4 | 0.2039 | 0.7677 | 1.0360 | 19.68 | 23.06 | 37.58 | 5.17 | 10.46 |

DISK COMPOSITIONS

| Disk | CoAlloy | Structure | Hcr (Oe) | Mrt (memu/cm$^2$) |
| --- | --- | --- | --- | --- |

TABLE II-continued

| | | | | |
|---|---|---|---|---|
| 1 | $CoCr_{.11}Pt13 + SiO_2(6\%)$ | $NiP(2\%)/CRPS6/Carbon[80Å/210Å/100Å]$ | 2309 | 0.8 |
| 2 | $CoCr_{.12}Pt_{.12} + SiO_2(8\%)$ | $Cr/CRPS8/Carbon[480Å/250Å/100Å]$ | 2277 | 1.0 |
| 3 | $CoCr_{.12}Pt_{.12} + SiO_2(8\%)$ | $NiAl/Cr/CRPS8/Carbon[150Å/200Å/250Å/100Å]$ | 2384 | 0.9 |
| 4 | $CoCr_{.12}Pt_{.12} + SiO_2(8\%)$ | $NiP(2\%)/Cr/CRP8/Carbon[150Å/200Å/250Å/100Å]$ | 2365 | 0.9 |

TEST PARAMETERS

| | | | |
|---|---|---|---|
| HF = 51.86 mhz = 158.118 kfci | radius = 0.87 inches | Preamplifier = SSI 32R2010R | Tester: Guzik RWA 1632/1701 |
| MF = 25.93 mhz = 79.06 kfci | 7200 rpm = 655 96 ips | Para. Filter = 100 MHZ 5 Pole Butterworth | Head: Seagate |
| OW = 51.86 mhz = 158.118 kfci | Jitter = 25.93 mhz = 79.06 kfci | Jitter Filter = SSI 32F 8001, 30 Mhz, 0 dB | $I_w$ = 35 mA 0 to peak $I_{bias}$ = 12 mA |

Table II shows magnetic recording performance results of four different disks prepared using various underlayers as proposed by the prior art and by the present invention. The sample preparation and the structures and alloys are described as follows:

Disk No. 1: This disk was prepared by first depositing an approximately 80 Å thick underlayer of NiP+2 mol. % $Al_2O_3$ on an NiP plated Al substrate. Next, an approximately 210 Å thick $CoCr_{0.11}Pt_{0.13}$+6 mol. % $SiO_2$ magnetic recording layer was deposited onto the NiP layer. An overcoat of carbon approximately 100 Å thick was then deposited over the magnetic recording layer. Deposition for this disk was in an in-line puttering system in accordance with the procedures described in U.S. patent application Ser. No. 08/286, 653. The average Hcr was 2309 Oe.

Disk No. 2: This disk was prepared by first depositing an approximately 480 Å thick Cr underlayer directly onto an NiP plated Al substrate. This was followed by depositing an approximately 250 Å thick $CoCr_{0.12}Pt_{0.12}$+8 mol. % $SiO_2$ magnetic recording layer. This was followed by deposition of an approximately 100 Å thick carbon overcoat. These disks are similar to those used by Lee et al. in EP0704839 A1, and were made in the aforementioned Anelva sputtering system. The average Hcr was 2277 Oe.

Disk No. 3: This disk was prepared by first depositing an approximately 150 Å thick NiAl seed layer directly onto an NiP plated Al substrate. Next, an approximately 200 Å thick Cr intermediate layer was deposited onto the NiAl seed layer. This was followed by depositing an approximately 250 Å thick $CoCr_{0.12}Pt_{0.12}$+8 mol. % $SiO_2$ magnetic recording layer. This was followed by deposition of an approximately 100 Å thick carbon overcoat. This disk represents one embodiment of the present invention. All deposition took place in the aforementioned Anelva sputtering system. The average Hcr was 2384 Oe.

Disk No. 4: This disk was prepared by first depositing an approximately 150 Å NiP+2 mol. % $Al_2O_3$ underlayer directly onto an NiP plated Al substrate. Next, an approximately 200 Å thick Cr intermediate layer was deposited onto the NiP layer. This was followed by depositing an approximately 250 Å thick $CoCr_{0.12}Pt_{0.12}$+8 mol. % $SiO_2$, magnetic recording layer. This was followed by deposition of an approximately 100 Å thick carbon overcoat. All deposition took place in the aforementioned Anelva sputtering system. The average Hcr was 2365 Oe.

Measurements were made using a Guzik model RWA 1632/1701 Spinstand, manufactured by Guzik, Santa Clara, Calif. A magnetoresistive (MR) magnetic recording head model Cuda IV XL manufactured by Seagate of Scotts Valley, Calif. was used. The disk rpm was 7200, and measurements were made at a radius of 0.87 inches. Head bias was 12 mA 0-to-peak, and head current was 35 mA. The high frequency head signal was 51.86 mhz (158.118 kfci), mid frequency was 25.93 mhz (79.06 kfci). The overwrite frequency was 51.86 mhz (158.118 kfci), and the Write Jitter frequency was 25.93 mhz (79.06 kfci).

Comparing the values of OW, Write Jitter (WJ), and TNLD of disk no. 1 to the values for disks nos. 2, 3, and 4 from Table II shows that when a Co alloy magnetic recording layer is deposited on top of a Cr layer, higher OW and lower TNLD values are obtained. These results indicate that the Co alloy is epitaxially grown on the Cr surface, and also suggests that the Co alloy has its C-axis oriented predominantly in the plane of the disk.

However, comparing disks nos. 2, 3, and 4 in Table II shows that the WJ values of disks nos. 2 and 4 are almost twice that of disk no. 3, which is the disk formed by the teachings of the present invention. The high WJ of disk No. 2 in which the Cr layer is deposited directly on amorphous NiP substrate surface, and disk No. 4 in which the Cr layer is deposited on a sputtered amorphous NiP+2% $Al_2O_3$ layer, is due to the formation of large Cr grains, and as a consequence of the epitaxial growth of the Co on the Cr, the Co grains grow larger than those of disk no. 3. The use of a seed layer below the Cr intermediate layer as taught by this invention (e.g., disk no. 3) produces fine Cr grain, and hence fine Co alloy grains, which lowers WJ. (Further evidence of large Co alloy grain growth in disks nos. 2 and 4 will be shown latter.) These results verify that a disk created using the teachings of the present invention is superior to that of prior art in obtaining excellent OW and TNLD, and simultaneously low WJ and hence low intrinsic media noise.

In another embodiment of the present invention, disks using various thicknesses of a Ti seed layer and Cr intermediate layer were prepared. The magnetic properties of these disks were compared to the properties of a disk prepared using a NiAl seed layer in Table III.

TABLE III

DISK DATA

| Disk | Amplitude | | | Resolution (%) | PW50 (ns) | OW (dB) | Wrt Jtr (nm) | TNLD (%) |
| --- | --- | --- | --- | --- | --- | --- | --- | --- |
| | High Freq. (mVpp) | Mid Freq. (mVpp) | Low Freq. (mVpp) | | | | | |
| 5 | 0.205 | 0.653 | 0.825 | 79.10 | 35.42 | 35.53 | 3.26 | 14.25 |
| 6 | 0.209 | 0.689 | 0.874 | 78.88 | 35.85 | 37.70 | 3.45 | 15.10 |
| 7 | 0.232 | 0.706 | 0.0.851 | 83.00 | 33.92 | 38.26 | 3.54 | 15.71 |

DISK COMPOSITIONS

| Disk | CoAlloy | Structure | Hcr (Oe) | Mrt (memu/cm$^2$) |
| --- | --- | --- | --- | --- |
| 5 | $CoCr_{.12}Pt_{.12}$ + $SiO_2$(8%) | Ti/Cr/CRPS/Carbon [100Å/600Å/210Å/100Å] | 2198 | 0.85 |
| 6 | $CoCr_{.12}Pt_{.12}$ + $SiO_2$(8%) | Ti/Cr/CRPS/Carbon [300Å/400Å/240Å/100Å] | 2181 | 0.96 |
| 7 | $CoCr_{.12}Pt_{.12}$ + $SiO_2$(8%) | NiAl/Cr/CRPS/Carbon [150Å/400Å/200Å/100Å] | 2383 | 0.81 |

TEST PARAMETERS

HF = 30.58 mhz = 161 kfci   radius = 0.862 inches   Preamplifier = SSI 2010R   Tester: Guzik RWA 1632/1701
MF = 15.29 mhz = 81 kfci   4200 rpm = 379 ips   Para. Filter = 100 MHZ 5 Pole Butterworth   Head: Toshiba MR2
OW = 15.29 mhz   Jitter = 15.29 mhz   Jitter Filter = SSI 32F 8001, 13 Mhz, 4 dB   $I_w$ = 30 mA 0 to peak
   $I_{bias}$ = 10 mA Disk No. 5: This disk was prepared by first depositing an approximately 100 Å thick Ti seed layer on an NiP plated Al substrate. Next, an approximately 600 Å thick Cr intermediate layer was deposited onto the Ti seed layer. This was followed by depositing an approximately 200 Å thick $CoCr_{0.12}Pt_{0.12}$+8 mol. % $SiO_2$ magnetic recording layer. This was followed by deposition of an approximately 100 Å thick carbon overcoat. All deposition took place in the aforementioned Anelva sputtering system. The average Hcr was 2198 Oe, and the Mrt was 0.85 memu/cm$^2$.

Disk No. 6: This disk was prepared by first depositing an approximately 300 Å thick Ti seed layer on an NiP plated Al substrate. Next, an approximately 400 Å thick Cr intermediate layer was deposited onto the Ti seed layer. This was followed by depositing an approximately 200 Å thick $CoCr_{0.12}Pt_{0.12}$+8 mol. % $SiO_2$ magnetic recording layer. This was followed by deposition of an approximately 100 Å thick carbon overcoat. All deposition took place in the aforementioned Anelva sputtering system. The average Hcr was 2181 Oe, and the Mrt was 0.96 memu/cm$^2$.

Disk No. 7: This disk was prepared by first depositing an approximately 150 Å thick NiAl seed layer on an NiP plated Al substrate. Next, an approximately 400 Å thick Cr intermediate layer was deposited onto the NiAl seed layer. This was followed by depositing an approximately 200 Å thick $CoCr_{0.12}Pt_{0.12}$+8 mol. % $SiO_2$ magnetic recording layer. This was followed by deposition of an approximately 100 Å thick carbon overcoat. All deposition took place in the aforementioned Anelva sputtering system. The average Hcr was 2383 Oe, and the Mrt was 0.81 memu/cm$^2$.

Measurements were made using a Guzik RWA 1632/1701 spinstand, manufactured by Guzik, Santa Clara, Calif. A magnetoresistive (MR) magnetic recording head manufactured by Toshiba, Japan, model MR2 was used. The disk rpm was 4200, and measurements were made at a radius of 0.862 inches. Head bias was 10 mA 0-to-peak, and head current was 30 mA. The high frequency head signal was 30.58 mhz (181 kfci), mid frequency was 15.29 mhz (79.06 kfci), and the low frequency was 5.10 mhz (27 kfci). The Write Jitter and OW frequency was 15.29 mhz (79.06 KFCI).

The recording performance parameters for the disks shown in Table III illustrate that using a Ti seed layer provides TNLD, OW, and Write Jitter nearly identical to that of a NiAl seed layer for about the same Mrt (i.e., about the same low frequency amplitude) and slightly lower Hc (about 200 Oe less). This indicates that a Ti seed layer can serve equally effectively as a NiAl seed layer.

FIGS. 14a, 14b, 15a, 15b, 16a, and 16b show TEM cross sections, under identical magnification, of disks 2, 3, and 4 of Table II, respectively. FIG. 14a, (bright field image) and FIG. 14b (dark field image) of disk no. 2 and FIG. 16a, (bright field image) and FIG. 16b (dark field image) of disk no. 4 show that the Cr grains formed in these disks are exceedingly large, and consequently the epitaxially grown Co alloy grains are as large as the Cr underlayer grains. Whereas in FIG. 15a, (bright field image) and 15b (dark field image) of disk no. 3 one can see that comparatively much smaller grains are produced for both the Cr intermediate layer and the epitaxially grown Co alloy layer. The plan view of FIG. 6, representative of disk no. 3, shows a grain diameter of less than 100 Å (and well isolated grains), and confirms the fine grain structure shown in FIGS. 15a and 15b.

The micrographs of FIGS. 14a through 16b confirm our hypothesis that a nucleation layer comprising an extremely fine grained seed layer can form the basis for producing an extremely fine grained epitaxially grown Co alloy film. With reference to FIG. 15b, the dark field image shows that there is good grain to grain epitaxy between the grains of the Cr intermediate layer 24 and the grains of the CoPt magnetic alloy layer 16 (e.g., the uniform lighter color of the columns indicates a close match of crystallographic planes between the layers). The cross section of FIG. 4, representative of disk no. 3, shows the good epitaxy under higher magnification TEM.

Furthermore, the ability of a fine grained seed layer to provide the large grain angle boundaries for grain isolation is evidenced by the change in contrast intensity of dark field image between grains, for example as shown in FIG. 15b. These large grain angle boundaries allow segregant to diffuse to the grain boundaries to isolate the grains and hence produce extremely low intrinsic media noise as well as high OW and low TNLD.

It should be noted that the presence of $SiO_2$ in the admixed form of the magnetic alloy as per the Japanese Patent Application 5-197944 (Shimizu et al.) is not a sufficient condition to ensure the lowest write jitter noise. In fact, the published work by Shimizu et al. entitled "CoPtCr Composite Magnetic Thin Films" shows TEM micrographs of unmixed $CoPt_{0.18}Cr_{0.12}$ and composite $CoPt_{0.18}Cr_{0.12}+SiO_2$ films. This reference states that "the grain boundaries are not clear in either film, indicating a very fine structure. Energy-dispersive x-ray analysis (EDX) revealed that Si atoms are uniformly distributed all over the composite films without showing any noticeable segregations at grain boundary."

We believe that the reduction in media noise in Shimizu et al.'s $CoCrPt+SiO_2$ admixture arises primarily from the reduction in grain size, i.e., a reduction in grain noise. However, a reduction in grain size alone does not result in a reduction of noise caused by exchange coupling, which is the more dominant contributor to media noise. This shows that per the approach taught by Shimizu et al. (i.e., without a structured nucleation layer) one cannot achieve complete isolation between (i.e., complete exchange decoupling of) the magnetic grains. As stated earlier, the intergranular exchange induced noise has to be completely eliminated to obtain the lowest possible noise. As we have found, this can only happen if a proper structured nucleation layer (such as the seed layer plus intermediate layer discussed above, or the $NiP+Al_2O_3$ nucleation layer discussed in our pending application Ser. No. 08/286,653 now U.S. Pat. No. 5,658,659) is used to facilitate the segregation of the insulating segregant.

The extremely low intrinsic media noise as provided by the teachings of the present invention is highlighted by comparing the normalized integrated media noise power (MNP) of disks no. 1, no. 2, and no. 3. The integrated noise powers were normalized to the value of Mrt (or low frequency amplitude) for each disk to provide a meaningful comparison of the data. FIG. 14 shows the MNP data of disks no. 1, 2, and 3 as a function of linear recording density (kfci). As shown, the MNP of disk no. 3 (that according to the present invention) is about one-half that of disk no. 1 (which uses a Cr underlayer only).

Furthermore, FIG. 17 illustrates that the MNP obtained according to the present invention is well below that of the prior art. For example, Lee et al. in FIG. 15 of their EPO application EP 0704839 A1 show a relatively small difference in MNP, less than 10% improvement at 107 kfci, between their media having a NiAl underlayer and media having only a Cr underlayer, and in FIG. 16 of their patent application show about a 20% improvement at 107 kfci. This should be compared with a the difference in MNP of over about 54% at 107 kfci seen in FIG. 17 hereof between media with a structured nucleation layer (seed layer/Cr intermediate layer) as taught by the present invention and media having only a Cr underlayer. This difference is equal to over a 110% improvement in noise performance of the structured nucleation layer (seed layer/Cr intermediate layer structure) of the present invention over structures not employing such a structure.

FIG. 18 shows the non-linear distortion (%) of the media of Table II as function of linear recording density. As shown, the TNLD of disk no. 3 according to the present invention is virtually as low as that of disk no. 2 which uses only a Cr underlayer (e.g., having large Co grains) for each kfci.

Whereas disk no. 1 shows a higher NLD than that of the present invention in the range of frequencies measured, particularly above 100 kfci. Therefore, it is clear from FIG. 15 that media using a structured nucleation layer according to the present invention provides superior TNLD as compared, for example, to amorphous sputtered NiP of the prior art.

In summary, the above experimental evidence shows that media produced using the present invention provides superior media noise, OW, and TNLD as compared with the prior art. Also, this work demonstrates that our invention is quite different from the prior art such as Lee et. al, and Shimizu et al. based on the results of our media noise power measurements and the data for Ti and Cr—Cu seed layers.

A magnetic recording medium in accordance with the present invention is typically used in a disk drive 100 shown in FIG. 19, in which disk 10 is mounted on a rotor shaft 102 which, in turn, is rotated by a motor 104. A pair of read-write heads 106a, 106b are mounted on the end of associated arms 108a, 108b. Heads 106a, 106b can be ferrite heads, thin film heads, magneto-resistive heads, or other types of read-write heads. Heads 106a, 106b "fly" in proximity to disk 10, where they can write data to and read data from the magnetic film on sides 110a, 110b of disk 10, respectively.

Arms 108a, 108b can be moved inward or outward (directions 112 and 114, respectively) to permit heads 106a, 106b to access data tracks at different locations of the disk. Motion of arms 108a, 108b are controlled by a servo motor (not shown). Examples of disk drives are disclosed in U.S. Pat. Nos. 4,949,202 (Kim); 5,025,335 (Stefansky); 5,027,241 (Hatch); and 5,025,336 (Morehouse), each of which is incorporated herein by reference. Magnetic recording media in accordance with this invention can be incorporated in other types of disk drives as well.

While the invention has been described above with respect to the specific embodiments, those skilled in the art will appreciate that modifications may be made without departing from the spirit and scope of the invention. For example, the present invention has been described in terms of a media having a single magnetic recording layer. However, in certain applications of the present invention multiple magnetic recording layers may be employed, etc. Therefore, the above specific descriptions are presented as examples of embodiments of the present invention, and are not to be read as limiting the scope of the present invention.

What is claimed is:

1. A magnetic recording medium, comprising:
   a non-magnetic substrate having a primary plane; a structured nucleation layer, comprising, a seed layer of fine crystal grains, having random lattice plane orientations, formed directly on said non-magnetic substrate;
   an intermediate layer of crystal grains, formed on said seed layer grains, of sufficient thickness to allow an uppermost surface thereof to present primarily preferred lattice planes;
   a recording layer, generally epitaxially formed on said primarily preferred lattice planes, said recording layer having an epitaxial relationship determined primarily by said intermediate layer of said structured nucleation layer, comprising a Co-based hcp alloy and at least one segregant material, such that said Co-based alloy predominantly forms single crystallite magnetic grains of uniform size, said predominantly single crystallite magnetic grains having grain boundaries, said segregant material being disposed primarily at said grain boundaries, said single crystallite magnetic grains having their C-axes oriented predominantly parallel to the primary plane of said substrate.

2. The medium of claim 1, wherein said recording layer grains have a lattice mismatch to said intermediate layer grains of no more than 10%.

3. The medium of claim 1, wherein said intermediate layer is at least 80 Å thick.

4. The medium of claim 1, wherein said seed layer grains are of mean diameter of 50 Å or less, and said intermediate layer grains are of mean diameter of 100 Å or less.

5. The medium of claim 1, wherein said intermediate layer comprises Cr.

6. The medium of claim 5, wherein said intermediate layer comprises an alloy including Cr.

7. The medium of claim 1, wherein said seed layer comprises metallic elements producing grains smaller than 50 Å in diameter providing nucleation sites at which said intermediate layer grains form.

8. The medium of claim 1, wherein said seed layer comprises Ti.

9. The medium of claim 1, wherein said seed layer comprises predominantly B2 phase material.

10. The medium of claim 9, wherein said B2 phase material is structured NiAl.

11. The medium of claim 1, wherein said seed layer comprises an alloy of Cr and at least one other element, said at least one other element being present in an amount up to but not exceeding 10 at. % over the maximum solid solubility limit of said at least one other element in Cr.

12. The magnetic recording medium of claim 1, wherein said predominantly single crystallite magnetic grains are of a mean diameter of approximately 100 Å or less.

13. The magnetic recording medium of claim 12, wherein said predominantly single crystallite magnetic grains are spaced apart by between 5 Å and 50 Å.

14. The magnetic recording medium of claim 12, wherein said predominantly single crystallite magnetic grains are spaced apart by a mean distance of 10 Å.

15. The magnetic recording medium of claim 13, wherein a layer of segregant material having a thickness of at least 10 Å is disposed between pairs of adjacent predominantly single crystallite magnetic grains.

16. The magnetic recording medium of claim 1, wherein the medium includes only a single magnetic recording layer.

17. The magnetic recording medium of claim 1, wherein the segregant material is selected from the group comprising oxides and nitrides of Al, As, Co, Cr, Dy, Gd, La, Lu, Ni, Os, Pm, Ru, Re, Sc, Se, Si, Sm, Sn, Ta, Tb, Th, Ti, Tm, U, V, W, Y, and Zr having a bond strength of greater than 90 Kcal/mol.

18. In a magnetic recording medium wherein a magnetic recording layer comprising substantially a Co alloy is formed above a planar non-magnetic substrate, a structure having improved non-linear transition shift, write jitter, and over write performance, comprising:

a seed layer of fine crystal grains, having random lattice plane orientations, formed directly on said non-magnetic substrate;

an intermediate layer comprising at least in part Cr grains, formed on said seed layer grains, of sufficient thickness to allow an uppermost surface thereof to present primarily preferred lattice planes; and at least one segregant material deposited together with said Co alloy;

whereby said magnetic recording layer forms generally epitaxially on said primarily preferred lattice planes, said recording layer having an epitaxial relationship determined primarily by said intermediate layer of said structured nucleation layer, said Co-based alloy predominantly forms single crystallite magnetic grains of uniform size, said predominantly single crystallite magnetic grains having grain boundaries, said segregant material being disposed primarily at said grain boundaries, said single crystallite magnetic grains having their C-axes oriented predominantly parallel to the primary plane of said substrate.

19. A structured nucleation layer, formed above a planar non-magnetic substrate, and having formed thereon a substantially Co-alloy magnetic recording layer containing at least one segregant material, for providing said magnetic recording layer with improved non-linear transition shift, write jitter, and over write performance, comprising:

a seed layer of fine crystal grains, having random lattice plane orientations, formed directly on said non-magnetic substrate; and an intermediate layer comprising at least in part Cr grains, formed on said seed layer grains, of sufficient thickness to allow an uppermost surface thereof to present primarily preferred lattice planes;

whereby said magnetic recording layer forms generally epitaxially on said primarily preferred lattice planes, said recording layer having an epitaxial relationship determined primarily by said intermediate layer of said structured nucleation layer, said Co-based alloy predominantly forms single crystallite magnetic grains of uniform size, said predominantly single crystallite magnetic grains having grain boundaries, said segregant material being disposed primarily at said grain boundaries, said single crystallite magnetic grains having their C-axes oriented predominantly parallel to the primary plane of said substrate.

20. A disk drive containing a magnetic recording medium according to claim 1.

21. In a method of forming a magnetic recording medium wherein a magnetic recording layer comprising substantially a Co alloy is formed above a planar non-magnetic substrate, a method of improving non-linear transition shift, write jitter, and over write performance, comprising:

vacuum depositing a seed layer of fine crystal grains, having random lattice plane orientations, directly on said non-magnetic substrate;

vacuum depositing an intermediate layer of crystal grains on said seed layer grains, of sufficient thickness to allow an uppermost surface thereof to present primarily preferred lattice planes; and vacuum depositing together with said Co alloy at least one segregant material;

whereby said magnetic recording layer forms generally epitaxially on said primarily preferred lattice planes, said recording layer having an epitaxial relationship determined primarily by said intermediate layer of said structured nucleation layer, said Co-based alloy predominantly forms single crystallite magnetic grains of uniform size, said predominantly single crystallite magnetic grains having grain boundaries, said segregant material migrating primarily to said grain boundaries, and said Co-based alloy having a C-axis forming predominantly parallel to the primary plane of said substrate.

22. The magnetic recording medium of claim 1 wherein said segregant material is selected from the group consisting of oxides and nitrides having a bond strength of greater than 90 Kcal/mol., and wherein said predominantly single crystallite magnetic grains have their C-axes randomly oriented in the primary plane of said substrate.

23. The magnetic recording medium of claim 18 wherein said segregant material is selected from the group consisting of oxides and nitrides having a bond strength of greater than 90 Kcal/mol., and wherein said predominantly single crystallite magnetic grains have their C-axes randomly oriented in the primary plane of said substrate.

24. The structured nucleation layer of claim 19 wherein said segregant material is selected from the group consisting of oxides and nitrides having a bond strength of greater than 90 Kcal/mol., and wherein said predominantly single crystallite magnetic grains have their C-axes randomly oriented in the primary plane of said substrate.

25. The structured nucleation layer of claim 21 wherein said segregant material is selected from the group consisting of oxides and nitrides having a bond strength of greater than 90 Kcal/mol.

* * * * *

UNITED STATES PATENT AND TRADEMARK OFFICE
CERTIFICATE OF CORRECTION

PATENT NO. : 5,846,648
DATED : December 8, 1998
INVENTOR(S) : Chen et al.

It is certified that error appears in the above-identified patent and that said Letters Patent is hereby corrected as shown below:

Column 28,
Replace lines 49-57 with:
-- a non-magnetic substrate having a primary plane;
  a structured nucleation layer, comprising,
       a seed layer of fine crystal grains, having random lattice plane
       orientations, formed directly on said non-magnetic substrate;
       an intermediate layer of crystal grains, formed on said seed layer grains, of
       sufficient thickness to allow an uppermost surface thereof to present
       primarily preferred lattice planes;
a recording layer, generally epitaxially formed on said --

Column 29,
Replace lines 51-64 with:
18. In a magnetic recording medium wherein a magnetic recording layer comprising substantially a Co alloy is formed above a planar non-magnetic substrate, a structure having improved non-linear transition shift, write jitter, and over write performance, comprising:
a structured nucleation layer, comprising:
       a seed layer of fine crystal grains, having random lattice plane orientations,
       formed directly on said non-magnetic substrate; and
       an intermediate layer comprising at least in part Cr grains, formed on said seed
       layer grains, of sufficient thickness to allow an uppermost surface thereof to
       present primarily preferred lattice planes; and
at least one segregant material being deposited together with said Co alloy;

Column 30,
Replace lines 43-51 with:
-- vacuum depositing a structured nucleation layer, said vacuum depositing of said
  structured nucleation layer comprising:
       vacuum depositing a seed layer of fine crystal grains having random lattice
       plane orientations, directly on said non-magnetic substrate; and
       vacuum depositing an intermediate layer of crystal grains on said seed layer
       grains, of sufficient thickness to allow an uppermost surface thereof to present
       primarily preferred lattice planes; and
vacuum depositing together with said Co alloy at least one segregant material; --

UNITED STATES PATENT AND TRADEMARK OFFICE
CERTIFICATE OF CORRECTION

PATENT NO. : 5,846,648
DATED : December 8, 1998
INVENTOR(S) : Chen et al.

It is certified that error appears in the above-identified patent and that said Letters Patent is hereby corrected as shown below:

Column 32,
Line 5, replace "structured nucleation layer" with -- method --.

Signed and Sealed this

Twenty-first Day of December, 2004

JON W. DUDAS
*Director of the United States Patent and Trademark Office*